United States Patent
Choi et al.

(10) Patent No.: US 12,176,036 B2
(45) Date of Patent: Dec. 24, 2024

(54) MEMORY DEVICE FOR CONTROLLING WORD LINE VOLTAGE AND OPERATING METHOD THEREOF

(71) Applicant: Samsung Electronics Co., Ltd., Suwon-si (KR)

(72) Inventors: Sara Choi, Hwaseong-si (KR); Hyunkook Park, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 217 days.

(21) Appl. No.: 17/881,352

(22) Filed: Aug. 4, 2022

(65) Prior Publication Data

US 2023/0162795 A1    May 25, 2023

(30) Foreign Application Priority Data

Nov. 24, 2021    (KR) .......................... 10-2021-0163790

(51) Int. Cl.
| | | |
|---|---|---|
| *G11C 16/08* | (2006.01) | |
| *G11C 16/04* | (2006.01) | |
| *G11C 16/20* | (2006.01) | |
| *G11C 16/26* | (2006.01) | |

(52) U.S. Cl.
CPC .......... *G11C 16/08* (2013.01); *G11C 16/0483* (2013.01); *G11C 16/20* (2013.01); *G11C 16/26* (2013.01)

(58) Field of Classification Search
CPC ..... G11C 16/08; G11C 16/0483; G11C 16/20; G11C 16/26; G11C 11/5628; G11C 16/10; G11C 11/5642; G11C 16/30; G11C 16/32; G11C 8/08; G11C 5/145; H10B 41/27; H10B 43/27
See application file for complete search history.

(56) References Cited

U.S. PATENT DOCUMENTS

| | | |
|---|---|---|
| 8,570,808 B2 | 10/2013 | Park et al. |
| 8,625,367 B2 | 1/2014 | Yun et al. |
| 9,530,506 B2 | 12/2016 | Rabkin et al. |

(Continued)

FOREIGN PATENT DOCUMENTS

| | | |
|---|---|---|
| JP | 2007-035249 A | 2/2007 |
| KR | 10-2256918 B1 | 5/2021 |

OTHER PUBLICATIONS

European Search Report for corresponding EP Patent Application No. 22190969.0, dated Apr. 20, 2023.

*Primary Examiner* — Mohammed A Bashar
(74) *Attorney, Agent, or Firm* — Muir Patent Law, PLLC

(57) ABSTRACT

A memory device and an operating method thereof adjust a slope of a word line voltage. The memory device includes a memory cell array including a plurality of cell strings, a voltage generating circuit configured to generate a word line voltage provided to a plurality of word lines, and a control logic configured to output a slope control signal adjusting a voltage level variation characteristic of the word line voltage provided from the voltage generating circuit, wherein, during a prepulse period of a read operation of the memory device, a slope of a first word line voltage provided to an edge group including one or more word lines, the edge group adjacent to a string selection line is greater than a slope of a second word line voltage provided to a center group including one or more word lines in a center region.

20 Claims, 18 Drawing Sheets

(56) References Cited

U.S. PATENT DOCUMENTS

| | | |
|---|---|---|
| 9,905,305 B2 | 2/2018 | Chen et al. |
| 9,916,900 B2 | 3/2018 | Kim et al. |
| 10,026,487 B2 | 7/2018 | Chen et al. |
| 10,262,703 B2 | 4/2019 | Shimura et al. |
| 11,062,784 B2 | 7/2021 | Shim et al. |
| 2015/0268745 A1* | 9/2015 | Li .................. G06F 3/0412 345/173 |
| 2018/0088865 A1* | 3/2018 | Lee ............... G06K 19/0712 |
| 2019/0088336 A1* | 3/2019 | Lin .................... G11C 16/08 |
| 2019/0333588 A1 | 10/2019 | Yang et al. |
| 2021/0020256 A1 | 1/2021 | Kim et al. |
| 2021/0134367 A1 | 5/2021 | Lee |
| 2021/0327513 A1* | 10/2021 | Hwang ............... G11C 16/32 |

\* cited by examiner

MEMORY DEVICE FOR CONTROLLING WORD LINE VOLTAGE AND OPERATING METHOD THEREOF

CROSS-REFERENCE TO RELATED APPLICATION

This application is based on and claims priority under 35 U.S.C. § 119 to Korean Patent Application No. 10-2021-0163790, filed on Nov. 24, 2021, in the Korean Intellectual Property Office, the disclosure of which is incorporated by reference herein in its entirety.

BACKGROUND

The inventive concept relates to a memory device, and more particularly, to a memory device, which provides a word line voltage level associated with the improvement of read performance, and a memory system including the memory device and an operating method of the memory device.

Flash memory is a non-volatile memory, and may maintain data stored therein even when power is cut off. Storage devices, including flash memory such as a solid state drive (SSD) and a memory card, are being widely used and usefully used in storing or moving a large amount of data.

As the demand for the high capacity and miniaturization of non-volatile memory devices increases, three-dimensional (3D) memory devices including a plurality of vertical channel structures extending in a vertical direction on a substrate have been developed. In order to further improve the degree of integration of 3D memory devices, the number of word lines stacked on a substrate may increase, but due to the restriction of maximum current consumption (peak ICC) in a data read process, there is a limitation in increasing a level of a read voltage provided to word lines, causing a problem where a read time is longer.

SUMMARY

The inventive concept provides a memory device and an operating method thereof, which optimally control a level of a read voltage provided to word lines in a three-dimensional memory device.

According to an aspect of the inventive concept, a memory device includes a memory cell array including a plurality of cell strings, each of the plurality of cell strings including a string selection transistor, a plurality of memory cells, and a ground selection transistor arranged vertically, the string selection transistor being connected to a string selection line, the plurality of memory cells being respectively connected to a plurality of word lines, and the ground selection transistor being connected to a ground selection line, a voltage generating circuit configured to generate word line voltages provided to the plurality of word lines, and a control logic configured to output a slope control signal adjusting a voltage level variation characteristic of the word line voltage provided from the voltage generating circuit, wherein a first cell string of the plurality of cell strings includes a first edge group including one or more word lines, the first edge group adjacent to the string selection line, a second edge group including one or more word lines, the second edge group adjacent to the ground selection line, a center group including one or more word lines between the first edge group and the second edge group, and the voltage generating circuit is configured to provide a first word line voltage having a first slope to the word lines of the first edge group and provide a second word line voltage, which has a second slope which is less than the first slope, to the word lines of the center group in response to the slope control signal, during a prepulse period of a read operation of the memory device.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings.

Figure 1:
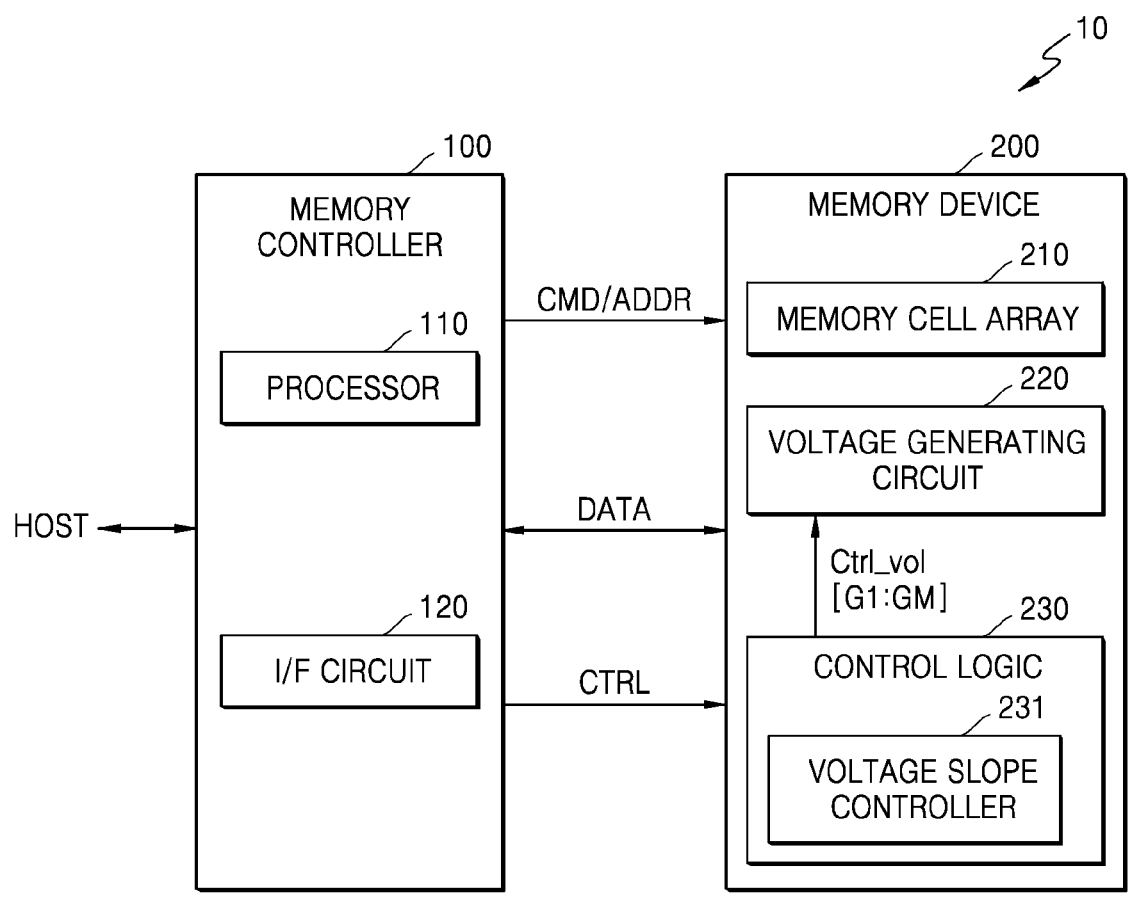
FIG. 1 is a block diagram illustrating a memory device and a memory system including the same, according to an embodiment.

FIG. 1 is a block diagram illustrating a memory device and a memory system 10 including the same, according to an embodiment.

Referring to FIG. 1, the memory system 10 may include a memory controller 100 and a memory device 200, the memory device 200 may include a memory cell array 210, a voltage generating circuit 220, and a control logic 230, and the control logic 230 may include a voltage slope controller 231. In the embodiment of FIG. 1, it is illustrated that the voltage slope controller 231 is included in the control logic 230, but the voltage slope controller 231 according to an embodiment may be implemented as a separate element outside the control logic 230.

The memory system 10 may communicate with a host HOST through various interfaces, and for example, the memory system 10 may communicate with the host HOST through various interfaces such as universal serial bus (USB), multimedia card (MMC), embedded MMC (eMMC), peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), Firewire, universal flash storage (UFS), and non-volatile memory express (NVMe).

According to an embodiment, the memory device 200 may include a non-volatile memory device, may be, for example, a semiconductor chip or semiconductor package (e.g., one or more semiconductor chips formed on a package substrate and being encapsulated with an encapsulation layer). In some embodiments, the memory system 10 may be implemented with a memory capable of being embedded into or detachably attached on an electronic device, and for example, the memory system 10 may be implemented as various types such as UFS, a memory package, an eMMC, a solid state drive (SSD), a UFS memory card, a compact flash (CF) card, a secure digital (SD) card, a micro secure digital (micro-SD) card, a mini secure digital (mini-SD) card, an extreme digital (xD) card, and a memory stick. Also, the memory system 10 may be referred to as a storage device, which non-volatilely stores data.

In response to a write/read request from the host HOST, the memory controller 100 may control the memory device 200 to read data stored in the memory device 200 or write data in the memory device 200. For example, the memory controller 100 may include a processor 110 and an interface circuit 120, and the processor 110 may control all operations of the memory controller 100. Also, the memory controller 100 may provide an address ADDR, a command CMD, and a control signal CTRL to the memory device 200 through the interface circuit 120, and thus, may control a write operation, a read operation, and an erase operation of the memory device 200. Also, data DATA to be stored in the memory device 200 and the data DATA read from the memory device 200 may be transferred and received between the memory controller 100 and the memory device 200.

The memory cell array 210 may include a plurality of memory cells, and for example, the plurality of memory cells may be flash memory cells. In an embodiment, the memory cell array 210 may include a three-dimensional (3D) memory cell array, the 3D memory cell array may include a plurality of cell strings, and each of the cell strings may include memory cells respectively connected to word lines vertically stacked on a substrate. However, the inventive concept is not limited thereto, and in some embodiments, the memory cell array 210 may include a two-dimensional (2D) memory cell array and the 2D memory cell array may include a plurality of cell strings arranged in a row direction and a column direction.

The voltage generating circuit 220 may generate various voltages used in the memory device 200, and for example, may generate a program voltage for a program operation and a read voltage for a read operation. Also, the voltage generating circuit 220 may variously adjust a level of the program voltage and a level of the read voltage on the basis of control by the control logic 230, and according to an embodiment, may adjust a variation characteristic (for example, a voltage slope) of a word line voltage provided to word lines in various periods of the program operation and the read operation. In an embodiment, in the 3D memory cell array, a plurality of word lines may be classified into two or more groups, and word line voltages having different variation characteristics may be provided to the groups on the basis of control by the voltage slope controller 231.

The control logic 230 may control all operations of the memory device 200, and for example, may output various internal control signals for programming data in the memory cell array 210 or reading data from the memory cell array 210 on the basis of the address ADDR, the command CMD, and the control signal CTRL each received from the memory controller 100. Also, according to an embodiment, the control logic 230 may output a slope control signal Ctrl_vol [G1:GM] for adjusting a variation characteristic of a word line voltage by group units in at least some of various operation periods, in association with the program operation, the read operation, and the erase operation.

An operation example of a memory device according to an embodiment will be described below.

In a memory device including the 3D memory cell array, maximum current consumption (hereinafter referred to as peak ICC) may be limited in a memory operation such as programming and read, and as the degree of integration of a memory device is improved, the number of word lines (or word line stacks) may increase, thereby increasing peak ICC. Therefore, as an example of a read operation, in order to prevent an excessive increase in peak ICC, there may be a limitation in quickly increasing a level of a word line voltage, and due to this, a time for performing the read operation may increase, causing a reduction in read performance. Also, in order to prevent hot carrier injection (HCI) caused by a boosting charge of a non-selected (e.g., unselected) cell string, a prepulse period for removing an electric charge of the non-selected cell string in a data read process may be provided, and due to this, there may be a problem where a time for performing the read operation increases more by adding the prepulse period.

According to an embodiment, a variation characteristic of the word line voltage may be improved, and thus, an increase in peak ICC may be prevented and a time for performing the read operation may decrease. For example, a plurality of word lines may be classified into at least two groups in a word line stack, and a voltage control operation may be performed so that a variation characteristic of the word line voltage provided by group units is differently set. For example, when a string selection line SSL is disposed relatively farther away from a substrate and a ground selection line GSL is disposed relatively close to the substrate, a group including one or more word lines adjacent to the string selection line SSL or the ground selection line GSL may be defined as an edge group, and the other groups (for example, a group disposed in a center region in the word line stack) may be referred to as a center group. In considering a vertical orientation of the memory cell array, the word line groups may be described as an upper group, a lower group, and a middle group, which is between the upper group and the lower group.

In an embodiment, variation characteristics of word line voltages provided to the edge group and the center group may be differently set. For example, a slope of the word line voltage provided to the edge group may be set to be greater than a slope of the word line voltage provided to the center group. Therefore, the word line voltage provided to the edge group may reach a target level at a faster speed than the word line voltage provided to the center group. Also, in an embodiment, the word line stack may include one or more edge groups and one or more center groups, and a setting operation may be performed to decrease a slope of a word line voltage in a direction from the edge group to the center group (or to increase a slope of a word line voltage in a direction from the center group to the edge group).

In an embodiment, when the word lines of the word line stack are classified into N number of groups, some of the N groups may correspond to the edge group, and the other groups may correspond to the center group. For example, when an edge group adjacent to the string selection line SSL is defined as a first edge group and an edge group adjacent to the ground selection line GSL is defined as a second edge group, one or more center groups may be disposed between the first edge group and the second edge group.

Also, in an embodiment, the voltage slope controller 231 may output a slope control signal Ctrl_vol[G1:GM] for controlling a variation characteristic of a word line voltage provided to the N groups. In an embodiment, at least some of the N groups may be supplied with word line voltages having the same variation characteristic, and thus, the number of slope control signals Ctrl_vol[G1:GM] may have a value which is less than or equal to the number (an N number) of groups. The voltage generating circuit 220 may include one or more voltage generators (not shown), and for example, may have a number corresponding to M number of voltage generators. Therefore, the M voltage generators may generate word line voltages having different variation characteristics in response to different slope control signals.

In the prepulse period, an electric charge of a channel of a cell string may be removed through a string selection transistor connected to the string selection line SSL or a ground selection transistor connected to the ground selection line GSL, and thus, a voltage of the channel may be initialized in a direction from an edge to a center. In an embodiment, because a slope of a word line voltage of an edge group is set to be relatively large, a path through which an electric charge is removed may be quickly formed, and thus, the initialization of a channel may be more quickly performed.

Also, because a slope of a word line voltage applied to the center group is set to be relatively less than an edge group, an increase in peak ICC simultaneously consumed by a memory device may be prevented. That is, total peak ICC may not increase and a variation characteristic of a word line voltage may be optimized based on a channel initialization period, and thus, a time of the prepulse period may be shortened and performance may be improved to decrease a time of the read operation without a degradation in HCI and peak ICC.

Figure 2:
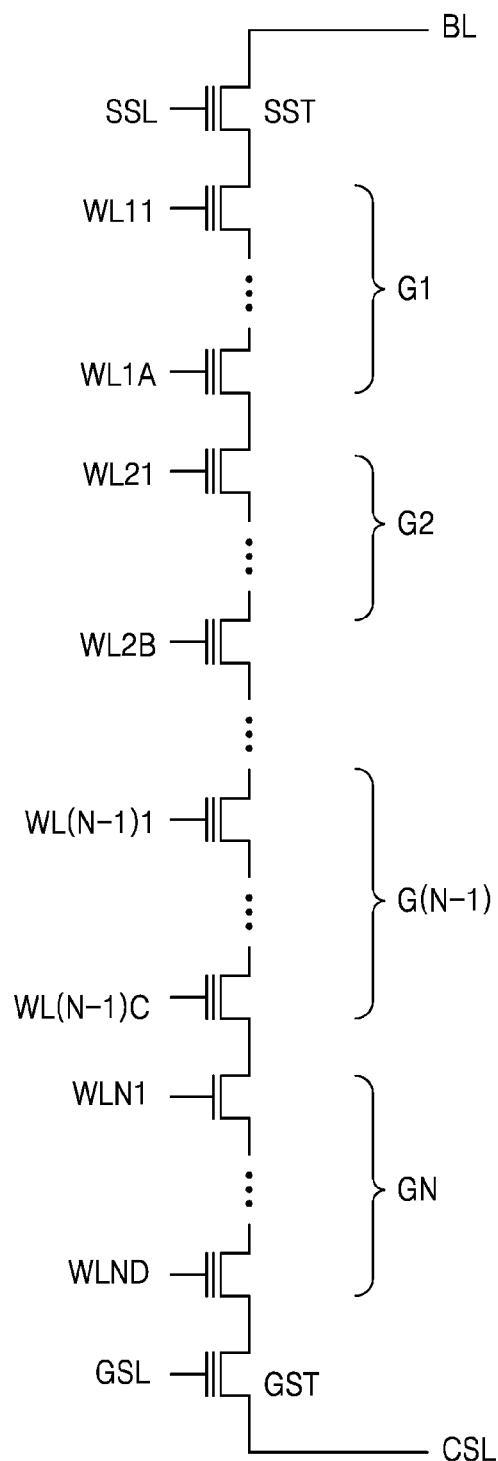
FIG. 2 is a diagram illustrating an example of grouping word lines according to an embodiment.

FIG. 2 is a diagram illustrating an example of grouping word lines according to an embodiment.

Referring to FIG. 2, a cell string may include a string selection transistor SST, a plurality of memory cells, and a ground selection transistor GST, which are connected between a bit line BL and a common source line CSL, and according to an embodiment described above, word lines respectively connected to the plurality of memory cells may be classified into a plurality of groups. For example, in FIG. 2, a case is illustrated where the word lines connected to the plurality of memory cells are classified into first to Nth groups G1 to GN, and some of the first to Nth groups G1 to Gn may correspond to an edge group and the others may correspond to a center group. The string selection transistor SST may be connected to the string selection line SSL, and the ground selection transistor GST may be connected to the ground selection line GSL.

Also, in the first to Nth groups G1 to GN, a variation characteristic of a word line voltage provided by group units may be differently set, and for example, as the first group G1 is adjacent to the string selection line SSL, a slope of a word line voltage provided to word lines WL11 to WL1A of the first group G1 may have a relatively large value. On the other hand, the second group G2 may be a center group disposed in a center region, compared to the first group G1, and thus, a slope of a word line voltage provided to word lines WL21 to WL2B of the second group G2 may have a relatively small value. The differences in slope value may refer to, for example a difference in average slope, and may be for example, a difference greater than 5% or 10%, such as 10% to 50% (e.g., the relatively larger slope for the first group G1 may be 10% to 50% higher than the relatively smaller slope for the second group G2), or 5% to 100%. Similar slope value differences may apply to the other embodiments discussed herein. In addition, a slope of the word line voltages described herein may refer to an average slope, and/or may refer to a slope of a ramp portion of a word line voltage (e.g., an average slope of a ramp portion of a word line voltage).

Also, the Nth group GN may be adjacent to the ground selection line GSL, and thus, a slope of a word line voltage provided to word lines WLN1 to WLND of the Nth group GN may have a relatively large value. On the other hand, the N−1th group G(N−1) may be a center group disposed in a center region, compared to the Nth group GN, and thus, a slope of a word line voltage provided to word lines WL(N−1)1 to WL(N−1)C of the N−1th group G(N−1) may have a relatively small value. As described herein, a particular group or set of word lines being adjacent to a ground selection line GSL means that no other word lines are between the ground selection line GSL and the particular group or set of word lines. Similarly, a particular group or set of word lines being adjacent to a string selection line SSL means that no other word lines are between the string selection line SSL and the particular group or set of word lines.

According to various embodiments, a slope of a word line voltage provided to the first to Nth groups G1 to GN may be variously set. For example, word line voltages may be separately generated based on the first to Nth groups G1 to GN, and thus, variation characteristics of word line voltages provided to the first to Nth groups G1 to GN may differ. Alternatively, a voltage variation characteristic of the first to Nth groups G1 to GN may vary based how close a corresponding group is to the string selection line SSL or the ground selection line GSL, and for example, variation characteristics of word line voltages applied to the first group G1 and the Nth group GN may be the same, and similarly, variation characteristics of word line voltages applied to the second group G2 and the N−1th group G(N−1) may be the same.

In an embodiment disclosed in FIG. 2, the number of word lines included in each group is illustrated by different signs and different values, but embodiments are not limited thereto and each group may include a various number of word lines.

Figure 3:
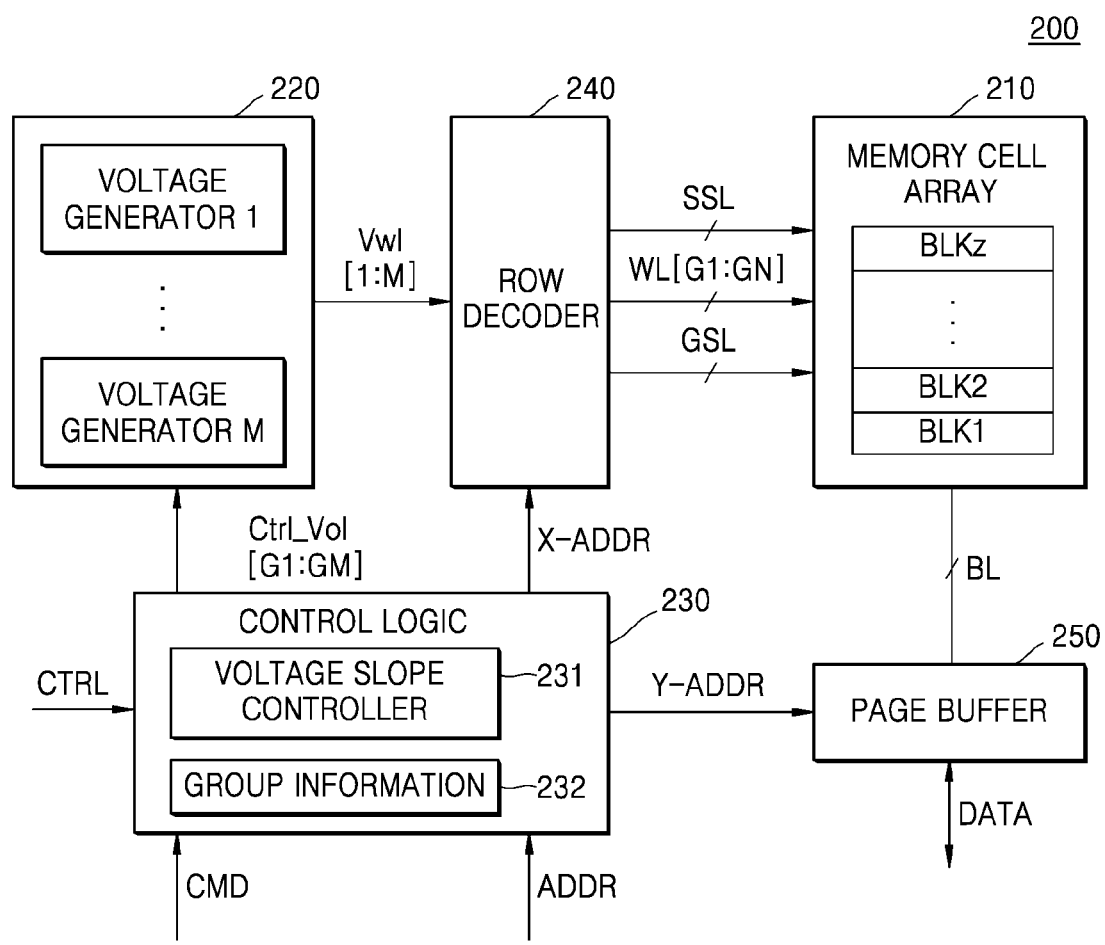
FIG. 3 is a block diagram illustrating an implementation example of the memory device of FIG. 1.

FIG. 3 is a block diagram illustrating an implementation example of the memory device 200 of FIG. 1.

Referring to FIGS. 1 to 3, a memory device 200 may include a memory cell array 210, a voltage generating circuit 220, a control logic 230, a row decoder 240, and a page buffer 250. Although not shown in FIG. 3, the memory device 200 may further include various elements, associated with a memory operation, such as a data input/output (I/O) circuit or an I/O interface.

The memory cell array 210 may include a plurality of memory blocks BLK1 to BLKz and may be connected to word lines WL, string selection lines SSL, ground selection lines GSL, and bit lines BL. The memory cell array 210 may be connected to the row decoder 240 through the word lines WL, the string selection lines SSL, and the ground selection lines GSL and may be connected to the page buffer 250 through the bit lines BL. Each of memory cells may store one or more bits, and for example, each memory cell may correspond to a multi level cell (MLC), a triple level cell (TLC), or a quad level cell (QLC).

In an embodiment, the memory cell array 210 may include a 3D memory cell array, the 3D memory cell array may include a plurality of cell strings, and each of the cell strings may include memory cells respectively connected to word lines vertically stacked on a substrate. U.S. Pat. Nos. 7,679,133, 8,553,466, 8,654,587, and 8,559,235 and U.S. Patent Application No. 2011/0233648, the disclosures of which are incorporated herein in their entirety by reference, disclose elements appropriate for a 3D memory cell array which are configured with a plurality of levels and where word lines and/or bit lines are shared between levels.

The control logic 230 may output various internal control signals for programming data in the memory cell array 210 or reading the data from the memory cell array 210, on the basis of a command CMD, an address ADDR, and a control signal CTRL each received from the memory controller 100. Also, the voltage generating circuit 220 may generate various voltages used in the memory device 200, and for example, may generate a word line voltage provided to word lines in association with a data write operation, a data read operation, and a data erase operation. For example, the word line voltage may include voltages provided to a selected word line and a non-selected (e.g., unselected) word line, and in addition, the voltage generating circuit 220 may further generate a string selection voltage and a ground selection voltage (not shown) respectively provided to the string selection line SSL and the ground selection line GSL.

The control logic 230 may output a voltage control signal for controlling levels of various voltages generated by the voltage generating circuit 220. According to an embodiment, the control logic 230 may include a voltage slope controller 231 and a group information storage circuit 232 and may output a slope control signal Ctrl_vol[G1:GM] for adjusting, by group units, a variation characteristic of a word line voltage applied to word lines WL. In FIG. 3, the voltage slope controller 231 and the group information storage circuit 232 are illustrated as being included in the control logic 230, but embodiments are not limited thereto and the voltage slope controller 231 and/or the group information storage circuit 232 may be provided outside the control logic 230.

As is traditional in the field of the disclosed technology, features and embodiments are described, and illustrated in the drawings, in terms of functional blocks, units and/or modules (e.g., voltage slope controller 231, control logic circuit 230, etc.). Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

The control logic 230 may provide a row address X-ADDR to the row decoder 240 and may provide a column address Y-ADDR to the page buffer 250. The row decoder 240 may provide a word line voltage, needed for various memory operations, to a word line connected to the selected memory cell and word lines connected to non-selected (e.g., unselected) memory cells, on the basis of the row address X-ADDR.

Each of the memory blocks BLK1 to BLKz may include one or more cell strings, and the cell string may include memory cells connected to a plurality of word lines WL classified into a plurality of groups based on an embodiment described above. In a process of manufacturing the memory device 200, a group including word lines WL may be set through a test process based on various factors such as peak ICC allowed in the memory device 200 and the number of word lines WL included in the memory cell array 210, and information about the set group may be stored in the group information storage circuit 232. Also, the voltage slope controller 231 may output a slope control signal Ctrl_vol[G1:GM] for performing control to provide word line voltages having different voltage variation characteristics, on the basis of information stored in the group information storage circuit 232.

According to an embodiment, the voltage generating circuit 220 may include a plurality of voltage generators (for example, first to Mth voltage generators), and the first to Mth voltage generators may output word line voltages Vwl[1:M] where a voltage variation characteristic thereof is adjusted, on the basis of the slope control signal Ctrl_vol[G1:GM]. Also, the row decoder 240 may provide the word line voltages Vwl[1:M] to first to Nth groups G1 to GN of the word lines WL, on the basis of the row address X-ADDR.

In an embodiment, group information may include pieces of information representing the number of groups, into which the word lines WL are classified, and whether each group corresponds to an edge group or a center group. The voltage slope controller 231 may output a slope control signal Ctrl_vol[G1:GM] for performing control so that a word line voltage, which has a voltage level variation characteristic where a slope is relatively large, is provided to a word line included in an edge group and performing control so that a word line voltage, which has a voltage level variation characteristic where a slope is relatively small, is provided to a word line included in a center group, on the basis of the group information. According to various embodiments, word line voltages provided to word lines of an edge group and a center group may have different slopes and may have the same target level (e.g., a voltage level, or the value of a voltage, at the end of the sloped portion or ramp portion). Alternatively, according to various embodiments, word line voltages provided to word lines of an edge group and a center group may have different slopes and target levels, and for example, a slope and a target level of the word line voltage provided to the word line of the center group may be set to be less than those of the word line voltage provided to the word line of the edge group.

Figure 4:
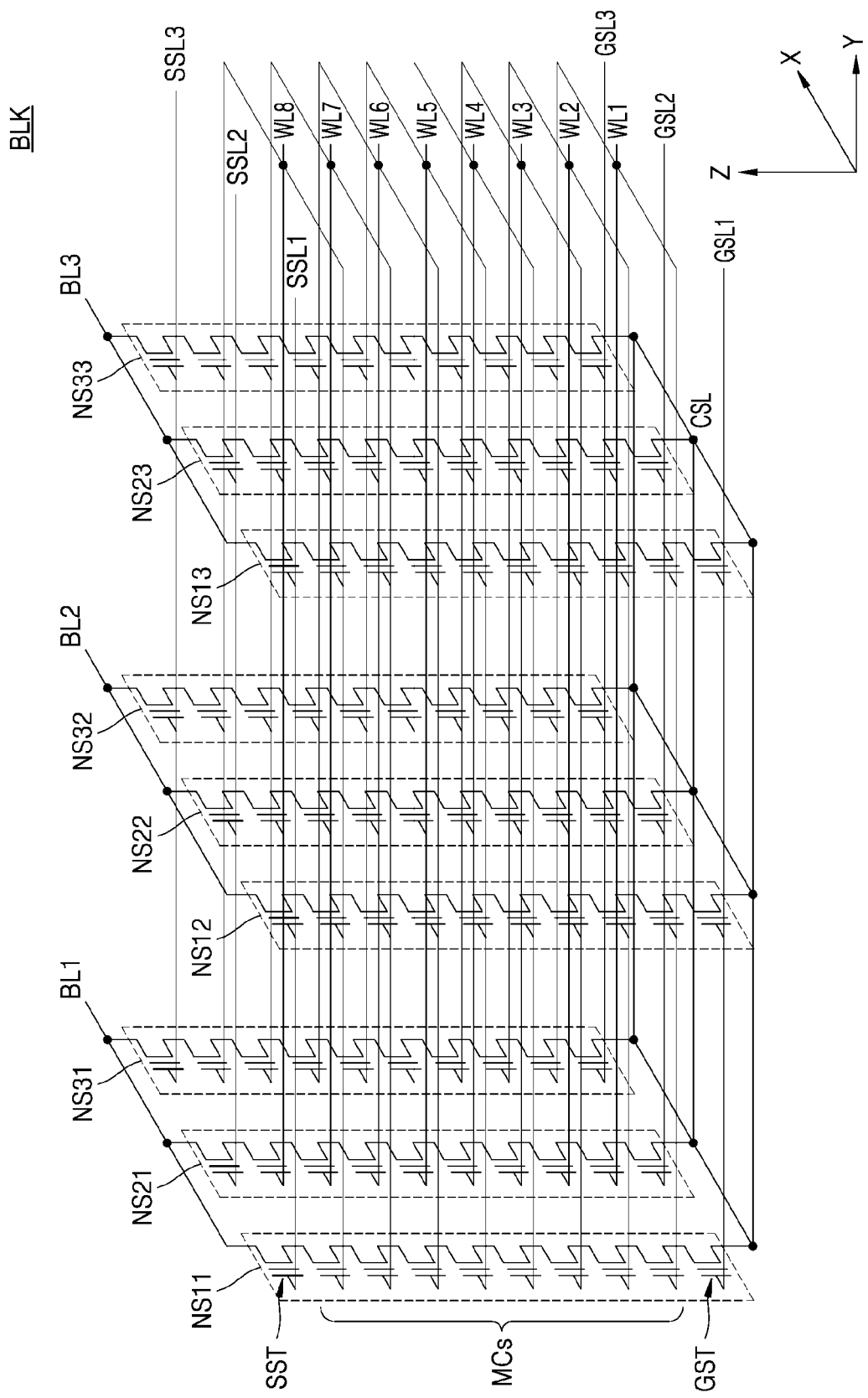
FIG. 4 is a circuit diagram illustrating an example of an equivalent circuit of a memory block implemented in a three-dimensional structure.

FIG. 4 is a circuit diagram illustrating an example of an equivalent circuit of a memory block implemented in a three-dimensional structure.

In FIG. 4, one memory block BLK of the plurality of memory blocks described above in the embodiment described above is illustrated, and the memory block BLK may include a plurality of cell strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. Here, the number of cell strings, the number of word lines, the number of bit lines, the number of ground selection lines, and the number of string selection lines may be variously changed according to embodiments.

The cell strings NS11, NS21, and NS31 may be provided between the first bit line BL1 and the common source line CSL, the cell strings NS12, NS22, and NS32 may be provided between the second bit line BL2 and the common source line CSL, and the cell strings NS13, NS23, and NS33 may be provided between the third bit line BL3 and the common source line CSL. Each cell string (for example, NS11) may include a string selection transistor SST, a plurality of memory cells MC, and a ground selection transistor GST, which are connected in series.

The string selection transistor SST may be connected to corresponding string selection lines SSL1 to SSL3. A plurality of memory cells MC may be respectively connected to corresponding word lines WL1 to WL8. The ground selection transistor GST may be connected to corresponding ground selection lines GSL1 to GSL3. The string selection transistor SST may be connected to corresponding bit lines BL1 to BL3, and the ground selection transistor GST may be connected to the common source line CSL.

In an embodiment, word lines (for example, WL1) having the same height may be connected to one another in common, the string selection lines SSL1 to SSL3 may be apart from one another, and the ground selection lines GSL1 to GSL3 may be apart from one another. In FIG. 4, it is illustrated that three string selection lines SSL1 to SSL3 share a word line having the same height, but the inventive concept is not limited thereto. For example, two string selection lines may share a word line having the same height. As another example, four string selection lines may share a word line having the same height. Also, a memory block having a 3D structure illustrated in FIG. 4 is merely one implementation embodiment, and a memory block according to embodiments may be variously modified. For example, a dummy word line connected to one or more dummy cells may be further included in a memory block. For example, one or more dummy word lines may be disposed under a first word line WL1, and moreover, one or more dummy word lines may be disposed on an eighth word line WL8.

According to an embodiment, the word lines WL1 to WL8 may be classified into a plurality of groups (for example, an edge group and a center group), and word line voltages having different voltage level variations (slopes) may be provided to the edge group and the center group. For example, control logic 230 combined with a voltage generating circuit 220 can be configured to provide word line voltages having different voltage level variations to different groups. Also, the word lines WL1 to WL8 may be arranged to be shared by a plurality of cell strings NS11 to NS33, and thus, a word line voltage provided to an edge group and a word line voltage provided to a center group may be provided to cell strings of at least some of the plurality of cell strings NS11 to NS33 in common. For example, a word line voltage provided to an edge group and a word line voltage provided to a center group according to embodiments may be provided to a selected cell string and a non-selected cell string together. For example, in the memory block BLK illustrated in FIG. 4, assuming that a first cell string NS11 of the cell strings NS11, NS21, and NS31 connected to the first bit line BL1 is a selected cell string, a prepulse voltage may be provided to the string selection lines SSL2 and SSL3 connected to second and third cell strings NS21 and NS31 adjacent to the first cell string NS11 in a prepulse period, and word line voltages may be provided to the cell strings NS11, NS21, and NS31 connected to the first bit line BL1 together.

Figure 5:
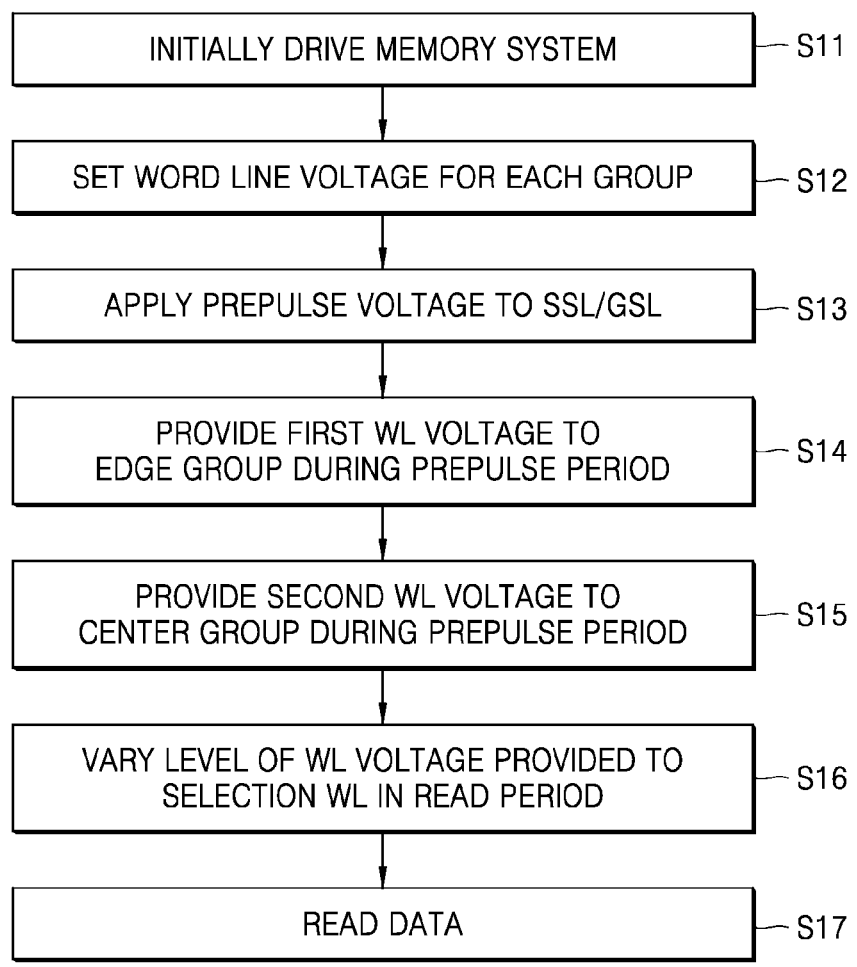
FIG. 5 is a flowchart illustrating an operating method of a memory device, according to an embodiment.

FIG. 5 is a flowchart illustrating an operating method of a memory device, according to an embodiment.

As a memory system or an electronic system including the same is initially driven in operation S11, various setting operations associated with a memory operation of the memory system may be performed, and for example, a word line voltage setting operation of each group may be performed based on group information associated with a group setting of word lines and stored in the memory system in operation S12. For example, a word line voltage setting operation may be performed based on group information associated with a first edge group including one or more word lines adjacent to an SSL, a second edge group including one or more word lines adjacent to a GSL, and a center group including one or more word lines disposed between the first edge group and the second edge group.

Subsequently, in a normal operation, the memory system may perform various memory operations, and for example, the memory device may receive a read request from a memory controller and a read operation may be performed on a selected memory cell of a plurality of memory cells of a cell string selected in response thereto. In an embodiment, the read operation may include a prepulse period, a prepulse voltage for removing an electric charge of a channel of a cell string may be provided to a string selection line SSL and/or a ground selection line GSL of a plurality of cell strings in common, and for example, the prepulse voltage may be provided to a selected cell string and a non-selected cell string in common in operation S13.

Also, according to an embodiment, word line voltages having different slopes may be provided to groups of a plurality of word lines during the prepulse period, and for example, a first word line voltage having a first slope may be provided to word lines of an edge group in common in operation S14. Also, during the prepulse period, a second word line voltage having a second slope which differs from the first slope may be provided to word lines of a center group in common in operation S15, and as the second slope has a value which is less than that of the first slope, a voltage level of the second word line voltage may gradually increase (e.g., may increase slower), compared to the first word line voltage. In this case, based on a length of the prepulse period or a slope setting, a target level of the first word line voltage may be set to have a value, which is greater than or equal to that of a target level of the second word line voltage.

Subsequently, as a read period starts, a selection word line voltage (e.g., word line voltage for a selected word line) having a certain level may be provided to a selected word line, and for example, the selection word line voltage may have a level which is lower than that of a voltage (for example, a pass voltage) provided to a non-selected word line, whereby a level of the selection word line voltage may vary in operation S16. In one embodiment, a selected word line may not be included in the edge group or the center group described above and may be supplied with the selection word line voltage during the prepulse period. Alternatively, in an embodiment, a selected word line may be included in an edge group or a center group on the basis of a position thereof and may be supplied with the first word line voltage or the second word line voltage during the prepulse period, and may be supplied with the selection word line voltage as the read period starts. The read period may include a develop period, and after the develop period, data may be read based on a sensing operation in operation S17.

Figure 6:
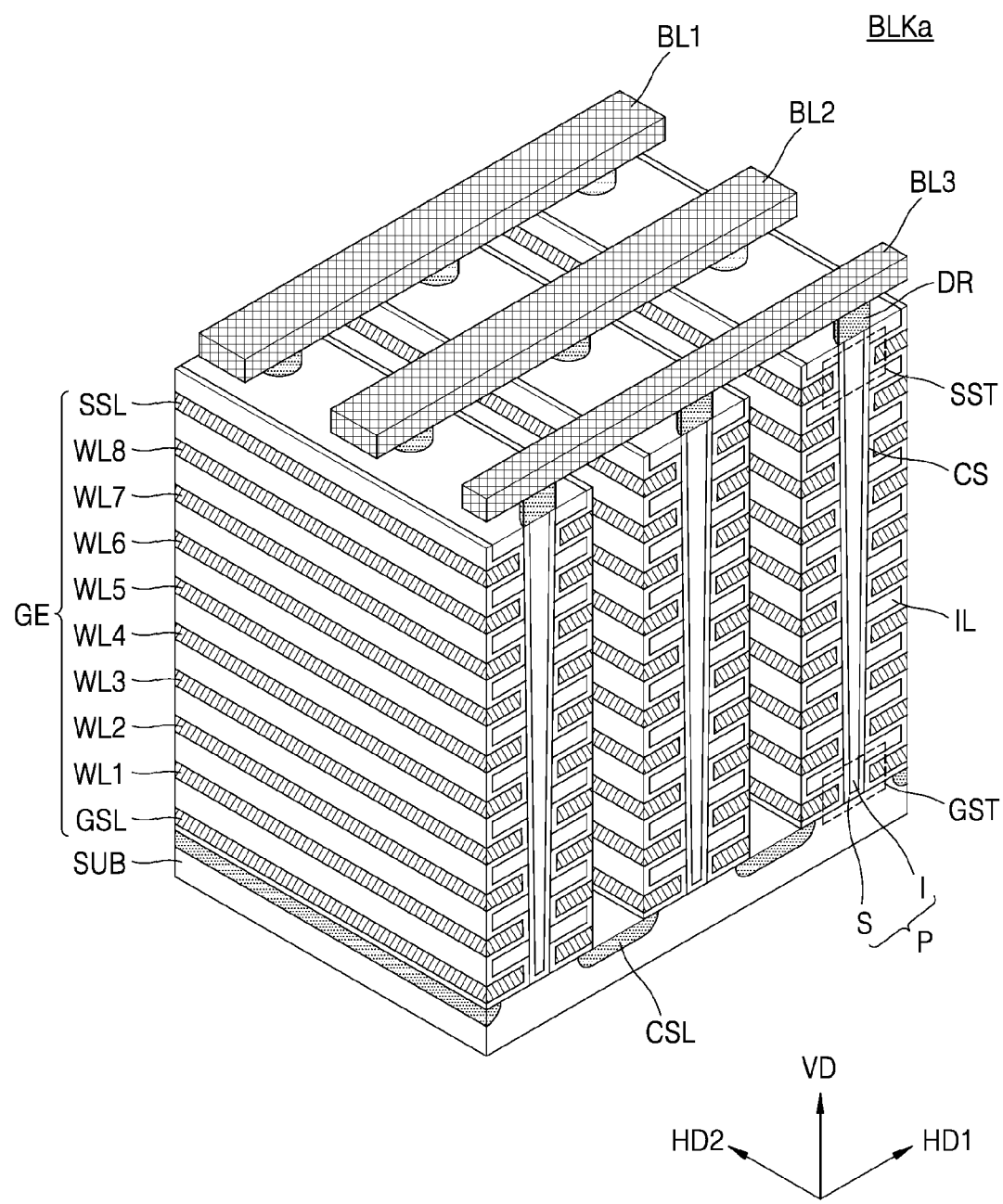
FIGS. 6 and 7 are perspective views illustrating a memory block BLKa according to an embodiment.
Figure 7:
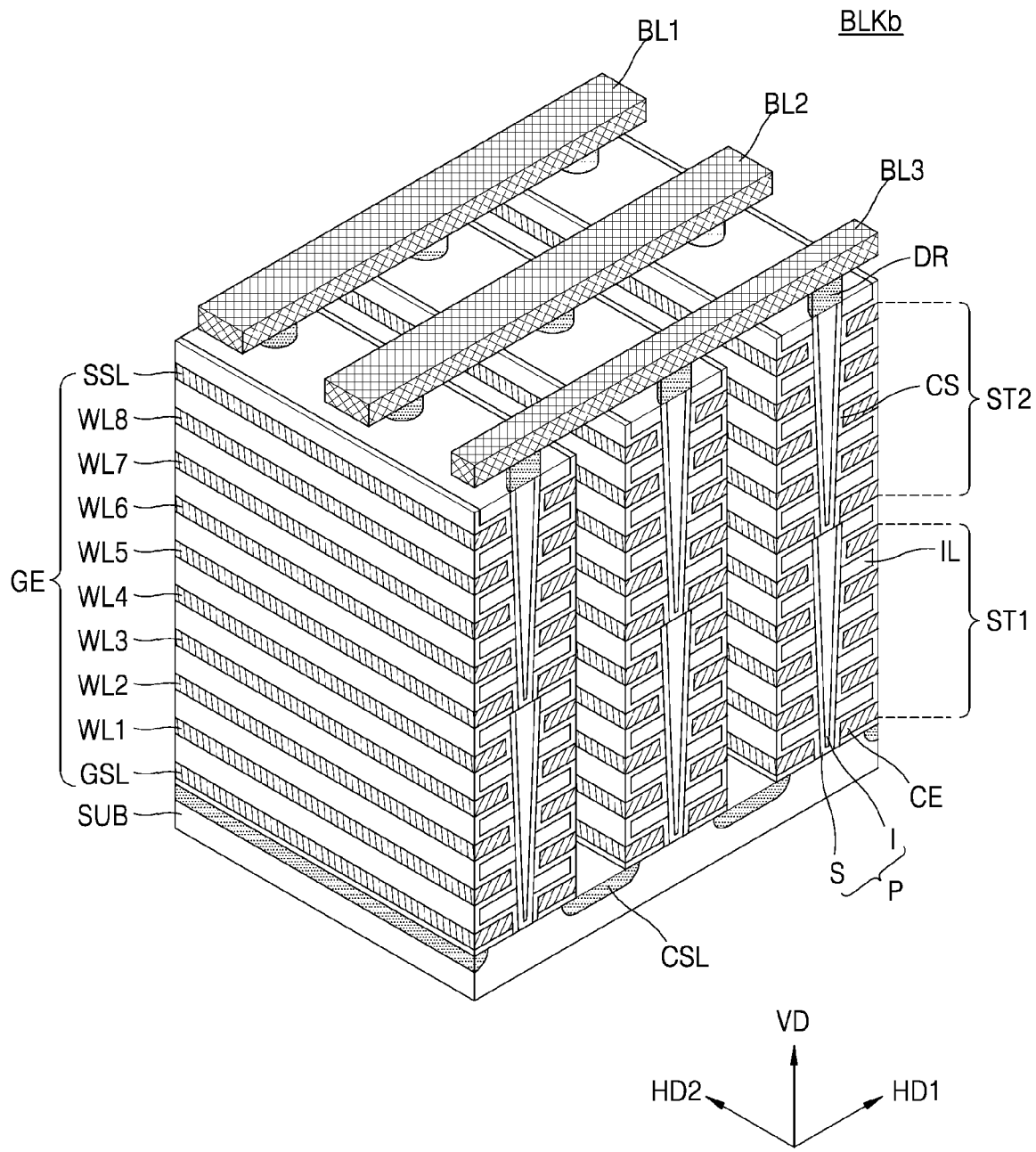

FIGS. 6 and 7 are perspective views illustrating a memory block BLKa according to an embodiment.

Referring to FIG. 6, the memory block BLKa may correspond to one of the plurality of memory blocks BLK1 to BLKz of FIG. 3. The memory block BLKa may be formed in a vertical direction VD with respect to a substrate SUB. The substrate SUB for each memory block may have a first conductive type (for example, a p type) and may extend (e.g., lengthwise) in a second horizontal direction HD1. In an embodiment, a common source line CSL doped with impurities having a second conductive type (for example, an n type) may be provided to the substrate SUB. In an embodiment, the substrate SUB may include polysilicon, and the common source line CSL having a plate shape may be disposed on the substrate SUB. A plurality of insulation layers IL extending (e.g., lengthwise) in the second horizontal direction HD2 may be sequentially arranged on the substrate SUB in the vertical direction VD and may be apart from one another by a certain distance in the vertical direction VD. For example, the plurality of insulation layers IL may include an insulating material such as silicon oxide. An item, layer, or portion of an item or layer described as extending "lengthwise" in a particular direction has a length in the particular direction and a width perpendicular to that direction, where the length is greater than the width.

A plurality of pillars P, which are arranged in the first horizontal direction HD1 and pass through the plurality of insulation layers IL in the vertical direction VD, may be provided on the substrate SUB. For example, the plurality of pillars P may pass through the plurality of insulation layers IL and may contact the substrate SUB. In detail, a surface layer S of each of the pillars P may include a silicon material having the first type and may function as a channel region. Therefore, in some embodiments, the pillar P may referred to as a channel structure or a vertical channel structure. Furthermore, an inner layer I of each pillar P may include an air gap or may be formed of an insulating material such as silicon oxide.

A charge storage layer CS may be provided along the insulation layers IL, the pillars P, and an exposed surface of the substrate SUB. The charge storage layer CS may include a gate insulation layer (or referred to as a tunneling insulation layer), a charge trap layer, and a blocking insulation layer. For example, the charge storage layer CS may have an oxide-nitride-oxide (ONO) structure. Also, a gate electrode GE, such as a ground selection line GSL, a string selection line SSL, and word lines WL1 to WL8 may be provided on an exposed surface of the charge storage layer CS.

Drain contacts or drains DR may be respectively provided on the plurality of pillars P. For example, the drains DR may include a silicon material doped with impurities having the second conductive type. Bit lines BL1 to BL3, which extend in the first horizontal direction HD1 and are apart from one another by a certain distance in the second horizontal direction HD2, may be provided on the drains DR. Each pillar P in the example of FIG. 6 may have an increasing horizontal width from a surface of the substrate SUB in a vertical direction away from the substrate SUB, up to the drain DR.

FIG. 7 is a perspective view illustrating a memory block BLKb according to an embodiment.

Referring to FIG. 7, the memory block BLKb may correspond to one of the plurality of memory blocks BLK1 to BLKz of FIG. 3. Also, the memory block BLKb may correspond to a modification example of the memory block BLKa of FIG. 6, and descriptions given above with reference to FIG. 6 may be applied to the embodiment of FIG. 7. The memory block BLKb may be formed in a vertical direction VD with respect to a substrate SUB. The memory block BLKb may include a first memory stack ST1 and a second memory stack ST2, which are stacked in the vertical direction VD. However, the inventive concept is not limited thereto, and the memory block BLKb may include three or more memory stacks. In each memory stack ST1 and ST2, each pillar P in the example of FIG. 7 may have an increasing horizontal width from a bottom surface to a top surface in a vertical direction away from the substrate SUB. Thus, a width of the pillar P at a top of the bottom memory stack (e.g., first memory stack ST1) may be greater than a width of the pillar P at a bottom of the top memory stack (e.g., second memory stack ST2).

Figure 8:
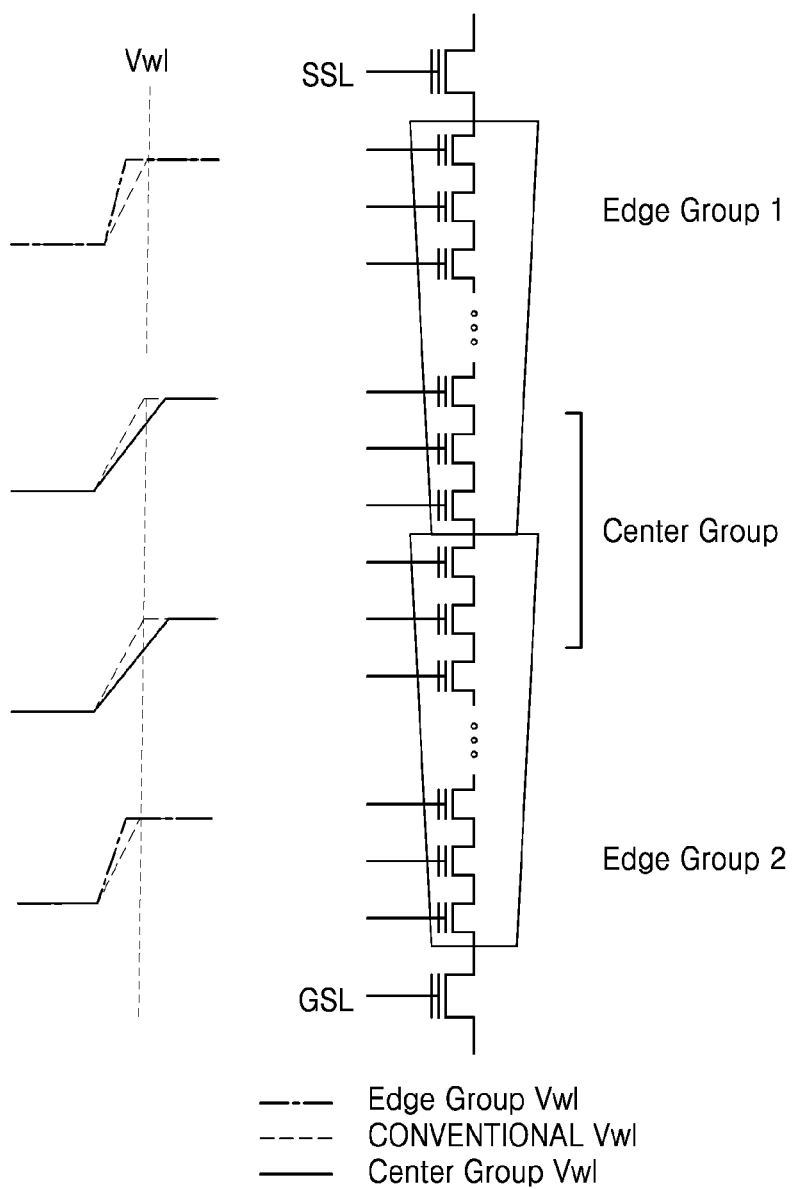
FIG. 8 is a diagram illustrating a group setting example according to an embodiment.

FIG. 8 is a diagram illustrating a group setting example according to an embodiment. In FIG. 8, a group setting example where a memory block includes a first memory stack and a second memory stack stacked in a vertical direction is illustrated. The combined first memory stack and second memory stack may be referred together as simply a memory stack. In addition, the same principles apply, when a single memory stack having two vertical sections is used (e.g., as in FIG. 6).

Referring to FIG. 8, each of the first memory stack and the second memory stack may include a plurality of memory cells and word lines connected thereto, a first set of word lines of the first memory stack may be adjacent to a string selection line SSL, and a first set of word lines of the second memory stack may be adjacent to a ground selection line GSL. Therefore, the first set of word lines of the first memory stack may be set to a first edge group adjacent to the string selection line SSL, and the first set of word lines of the second memory stack may be set to a second edge group adjacent to the ground selection line GSL. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Also, a second set of word lines of the first memory stack may be disposed in a center region, compared to the first edge group, and a second set of word lines of the second memory stack may be disposed in the center region, compared to the second edge group, and thus, the center region may be set to include word lines included in the first memory stack and the second memory stack.

Also, as illustrated in FIG. 8, assuming that a word line voltage illustrated by a dashed line is a conventional (or reference) word line voltage, a word line voltage provided to a first edge group and a second edge group may be set to have a slope, which is greater than that of a word line voltage provided to a center group. Also, a word line voltage provided to the first edge group and a word line voltage provided to the second edge group may be set to have the same slope as each other or different slopes from each other. Note, however, the slopes shown in relation to a conventional slope need not have the specific relationship shown in FIG. 8 to the conventional slope, as long as the slopes of the edge groups are greater than the slopes of the center groups. For example, either one or both of the edge groups, or the center group, may have the same slope as conventional word line voltage, and the other groups may vary therefrom as discussed above.

Figure 9:
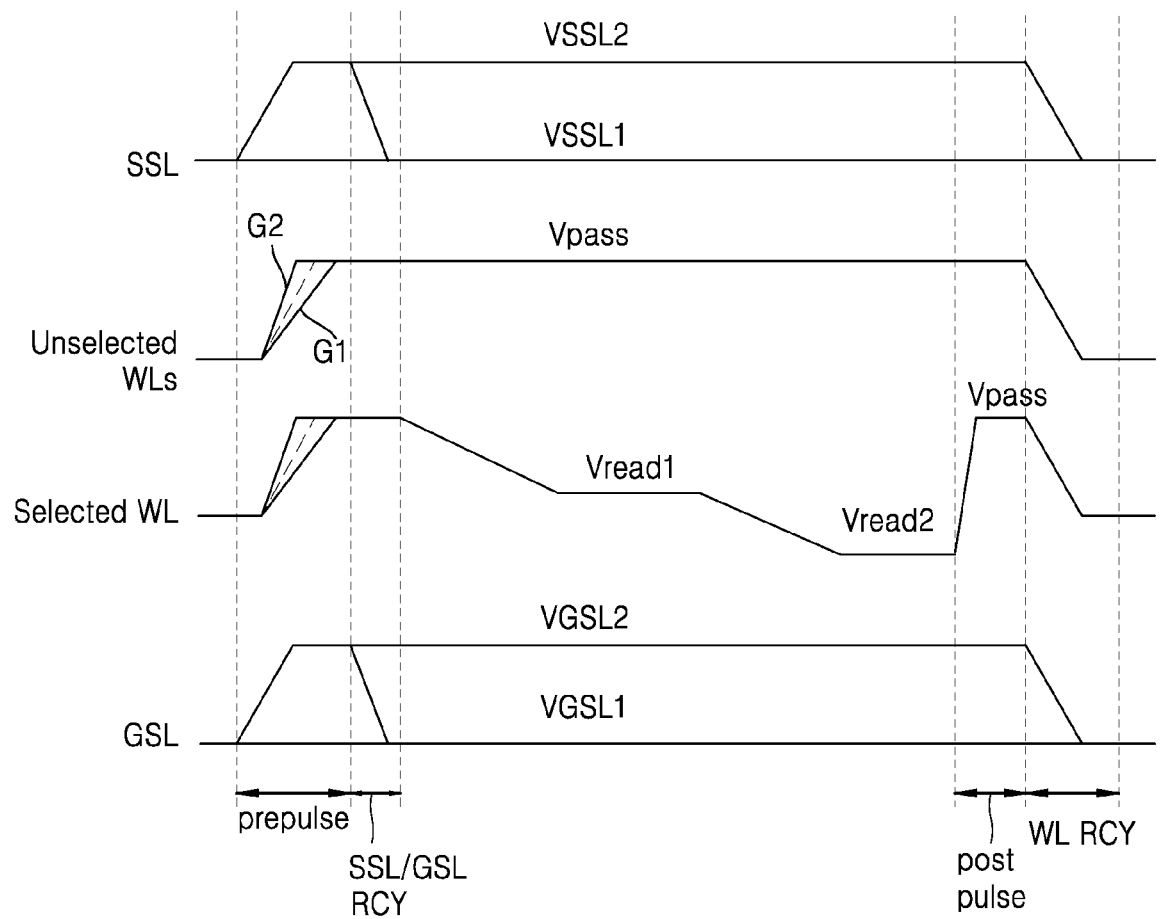
FIG. 9 is a diagram showing waveforms of various signals in a data read operation according to an embodiment.

FIG. 9 is a diagram showing waveforms of various signals in a data read operation according to an embodiment. Referring to FIG. 9, voltages provided to a string selection line SSL and a ground selection line GSL of a non-selected cell string may be respectively referred to as a first string selection line voltage VSSL1 and a first ground selection line voltage VGSL1, and voltages provided to a string selection line SSL and a ground selection line GSL of a selected cell string may be respectively referred to as a second string selection line voltage VSSL2 and a second ground selection line voltage VGSL2.

Referring to FIG. 9, after a prepulse period, a recycle period may be performed on the string selection line SSL and the ground selection line GSL of the non-selected cell string, and a ground voltage may be provided to the string selection line SSL and the ground selection line GSL of the non-selected cell string in the recycle period. However, during the recycle period, the voltage provided to the string selection line SSL and the ground selection line GSL of the selected cell string may remain at the prepulse voltage level.

In an embodiment, word line voltages may be provided to a plurality of word lines during the prepulse period (or the prepulse period and the recycle period), and for example, voltages having different slopes may be provided to word lines of a first group G1 and word lines of a second group G2. The different slopes refer to a slope of the voltage as it changes from a low level to a high level (e.g., at an initial time). For example, assuming that a variation characteristic (e.g., slope) of a reference word line voltage is illustrated by a dashed line, a word line voltage having a slope which is greater than that of the reference word line voltage may be provided to the word lines of the second group G2 corresponding to an edge group, and a word line voltage having a slope which is less than that of the reference word line voltage may be provided to the word lines of the first group G1 corresponding to a center group.

Furthermore, in a read period, a pass voltage Vpass may be applied to non-selected word lines, and selection word line voltages Vread1 and Vread2 may be provided to selected word lines. For example, each memory cell may store data of a plurality of bits, and thus, the selection word line voltages Vread1 and Vread2 may have various levels so as to selectively determine a plurality of threshold voltage distributions. Also, in an embodiment, during the prepulse period, a selection word line voltage (e.g., having a particular slope) may be provided to a selected word line, or as a selected word line is included in an edge group or a center group, the same voltage (e.g., having a particular slope) as a voltage applied to a non-selected word line may be provided to the selected word line. In the embodiment of FIG. 9, an example is illustrated where word line voltages having different slopes are provided depending on whether a selected word line is included in an edge group or a center group.

Furthermore, a post pulse period and a word line recycle period may be performed after the read period, and for example, the pass voltage Vpass may be applied to a selected word line in the post pulse period like a non-selected word line, and then, a word line recycle operation may be performed. In the word line recycle period, the ground voltage may be applied to the string selection line SSL, a plurality of word lines, and the ground selection line GSL so as to perform an initialization operation on various lines.

Figure 10:
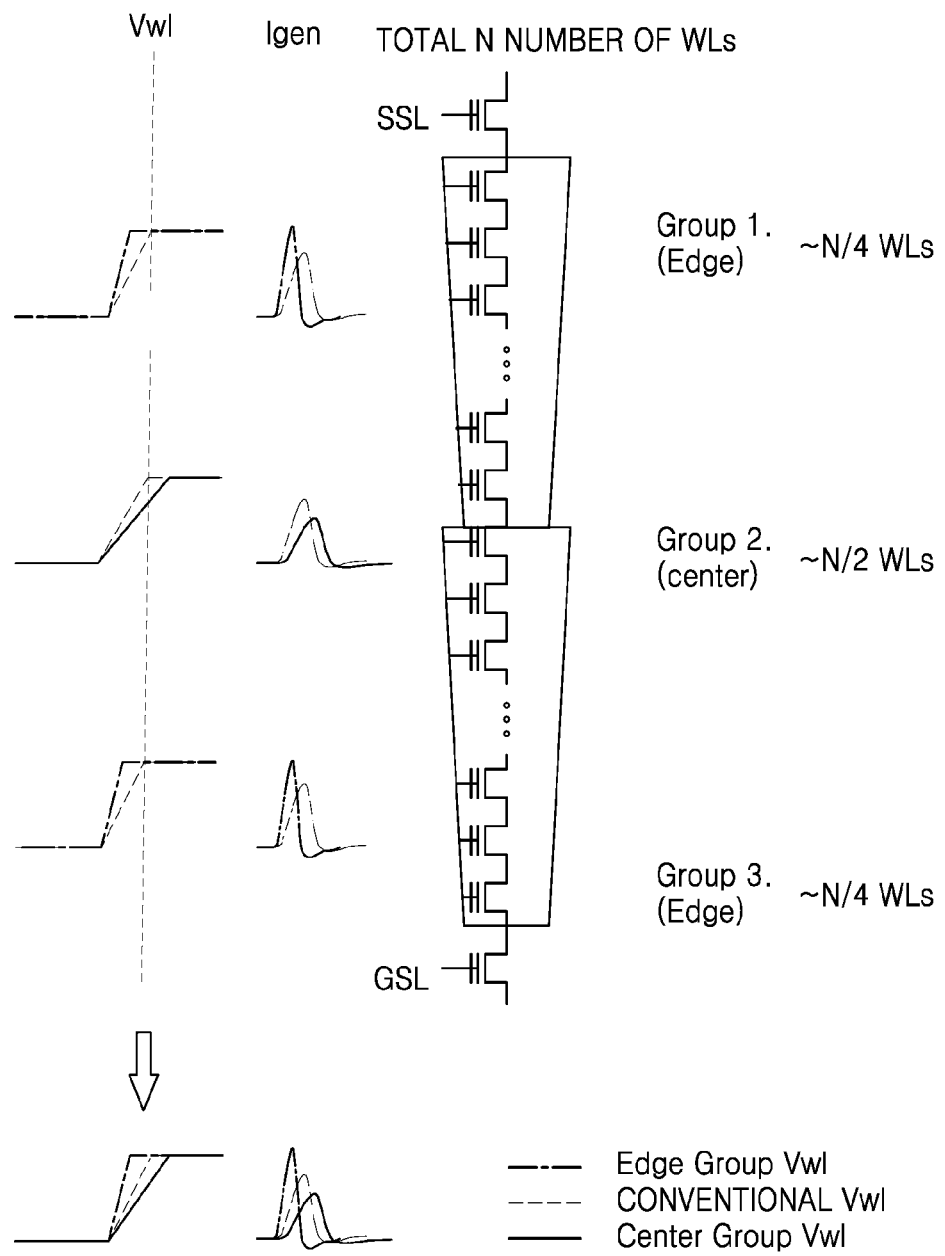
FIGS. 10 to 12 are diagrams illustrating various group setting examples according to an embodiment.
Figure 11:
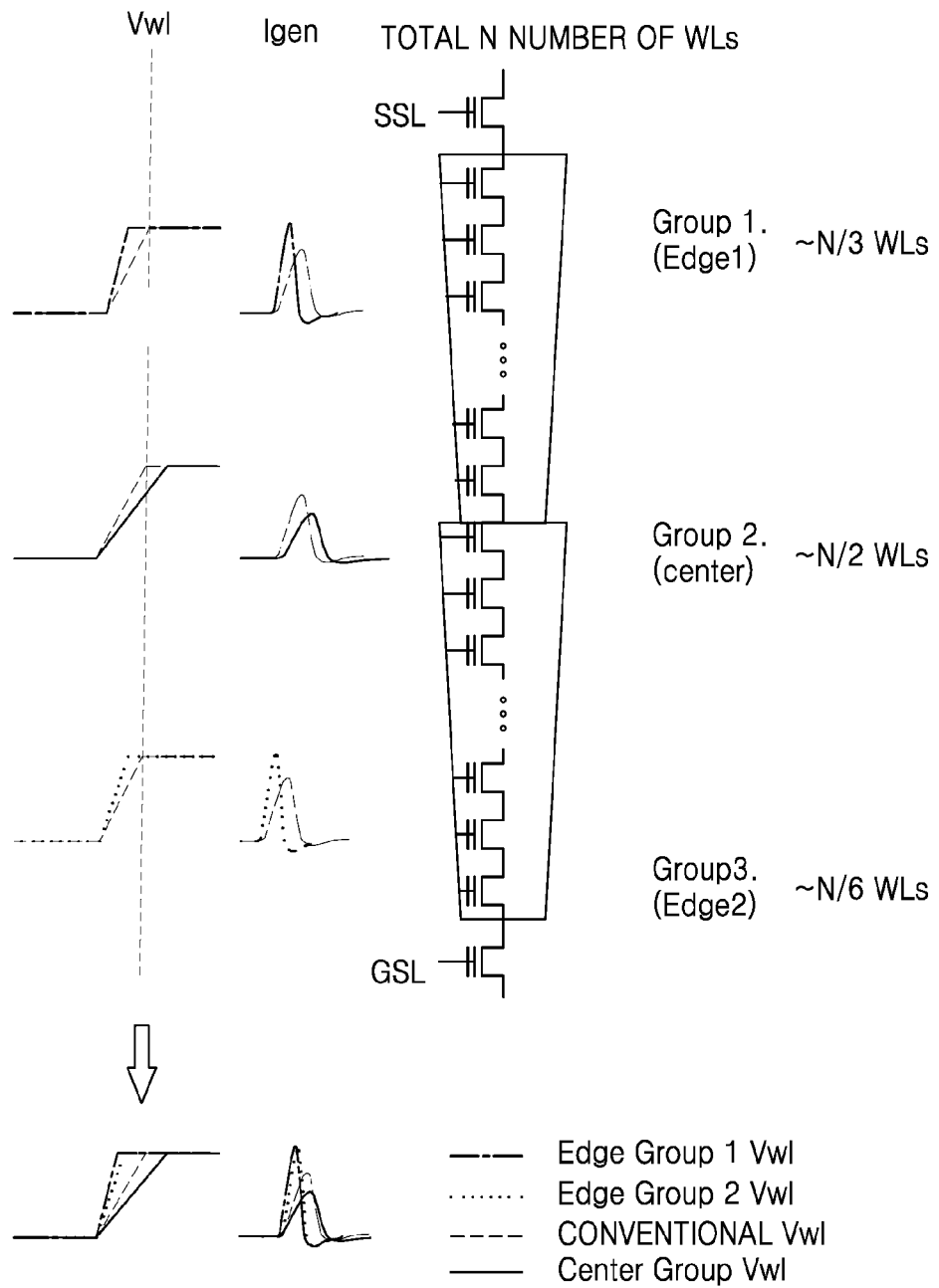
Figure 12:
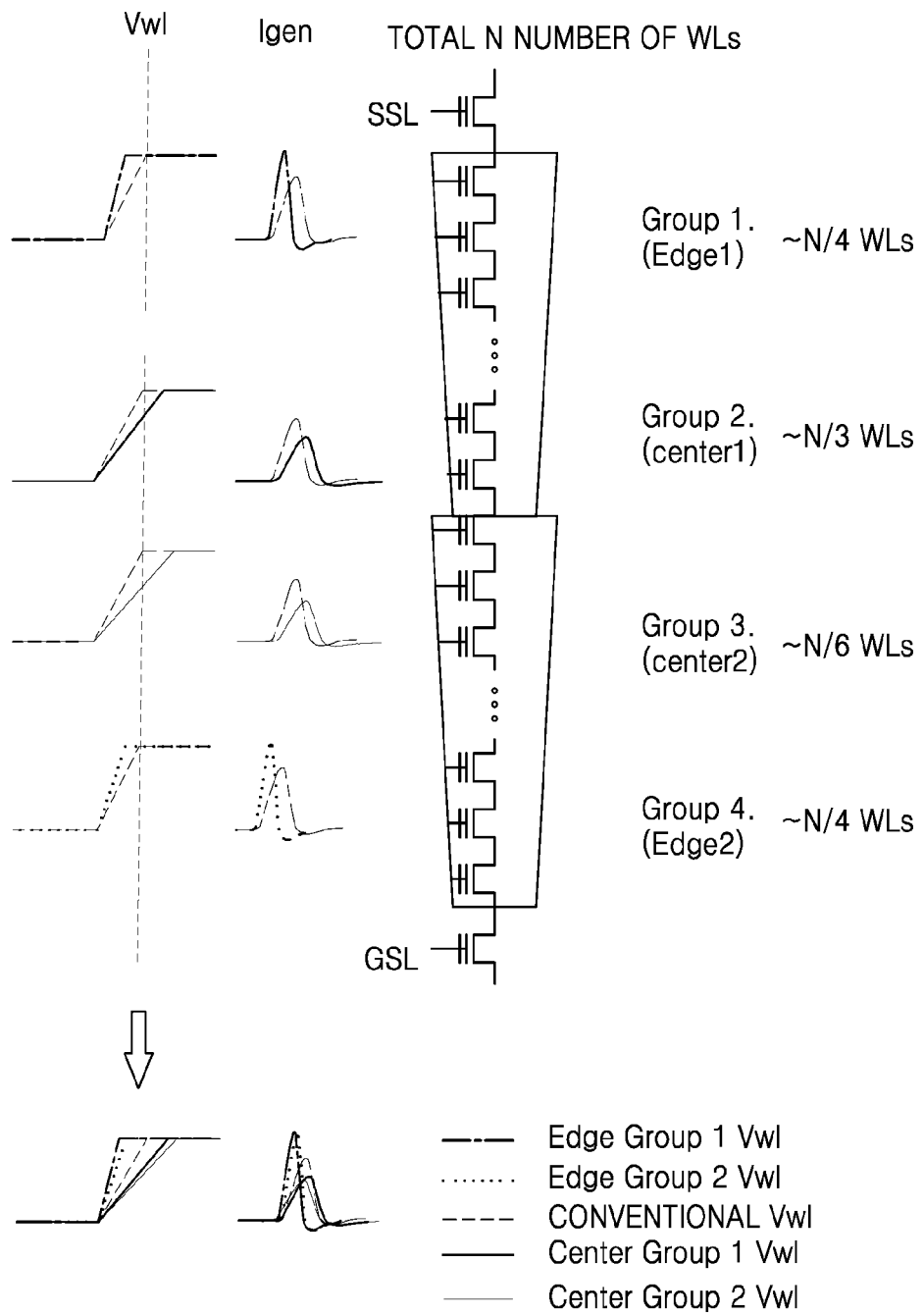

FIGS. 10 to 12 are diagrams illustrating various group setting examples according to an embodiment. In FIGS. 10 to 12, an example is illustrated where a memory block includes a first memory stack and a second memory stack stacked in a vertical direction, but embodiments are not limited thereto. Also, a word line voltage Vwl provided and a level of a current Igen consumed by each group are illustrated in FIGS. 10 to 12.

Referring to FIG. 10, N number of word lines may be arranged between a string selection line SSL and a ground selection line GSL, and a plurality of groups (for example, first to third groups Group 1 to Group 3) may be classified based on positions of word lines. The first group Group 1 may be an edge group adjacent to the string selection line SSL, the second group Group 2 may be a center group, and the third group Group 3 may be an edge group adjacent to the ground selection line GSL.

In an embodiment, the first to third groups Group 1 to Group 3 may be classified based on the number of N word lines. For example, N/4 number of word lines adjacent to the string selection line SSL of all word lines may be classified into the first group Group 1, and moreover, N/4 number of word lines adjacent to the ground selection line GSL may be classified into the third group Group 3. Also, the other N/2 word lines may be classified into the second group Group 2 corresponding to a center group. A plurality of word lines may be in each group, and the three groups may constitute all word lines of a memory block.

Also, as depicted in the embodiment of FIG. 10, word line voltages provided to the first group Group 1 and the third group Group 3 may have the same variation characteristic, and slopes of the word line voltages provided to the first group Group 1 and the third group Group 3 may be the same as each other and greater than the slopes of word line voltages provided to the second group Group 2. Accordingly, a case where levels of word line voltages provided to a plurality of word lines increase simultaneously and rapidly may be prevented, and thus, as illustrated in FIG. 10, a problem of total peak ICC increasing may be improved or prevented, because a current consumption characteristic differs for each word line.

Furthermore, referring to FIG. 11, a case is illustrated where variation characteristics of word line voltages provided to a group including word lines adjacent to the string selection line SSL and a group including word lines adjacent to the ground selection line GSL are differently set based on characteristics of word lines adjacent to the string selection line SSL and the ground selection line GSL. For example, N/3 number of word lines adjacent to the string selection line SSL may be classified into the first group Group 1, and moreover, N/6 number of word lines adjacent to the ground selection line GSL may be classified into the third group Group 3. The first group Group 1 may correspond to a first edge group, the third group Group 3 may correspond to a second edge group, and the other N/2 word lines may be classified into the second group Group 2 corresponding to a center group.

In an embodiment, word line voltages provided to the first edge group and the second edge group may have different variation characteristics, and for example, a slope of a word line voltage provided to the first group Group 1 may be greater than that of a word line voltage provided to the third group Group 3. Therefore, in a prepulse period, a path through which an electric charge is removed to the string selection line SSL may be quickly formed, and like an embodiment described above, an increase in total peak ICC may be prevented.

Furthermore, referring to FIG. 12, a case is illustrated where a variation characteristic of a word line voltage is differently set for each of a plurality of groups into which a plurality of word lines are classified.

For example, N/4 number of word lines adjacent to the string selection line SSL may be classified into the first group Group 1, and moreover, N/4 number of word lines adjacent to the ground selection line GSL may be classified into a fourth group Group 4. The first group Group 1 may correspond to the first edge group, and the fourth group Group 4 may correspond to the second edge group.

Also, word lines (for example, word lines of a center region) between the first group Group 1 and the fourth group Group 4 may be classified into at least two center groups, and for example, N/3 number of word lines close to the string selection line SSL among the word lines of the center region may be classified into the second group Group 2, the other N/6 word lines close to the ground selection line GSL may be classified into the third group Group 3, the second group Group 2 may correspond to a first center group, and the third group Group 3 may correspond to a second center group.

In an embodiment, variation characteristics of word line voltages provided to the first to fourth groups Group 1 to Group 4 may be differently set. For example, slopes of word line voltages provided to the first group Group 1 and the fourth group Group 4 may be greater than those of word line voltages provided to the second group Group 2 and the third group Group 3. Also, a slope of the word line voltage provided to the first group Group 1 may be greater than that of a word line voltage provided to the fourth group Group 4, and a slope of the word line voltage provided to the second group Group 2 may be greater than that of the word line voltage provided to the third group Group 3. Accordingly, in the embodiment illustrated in FIG. 12, a problem of total peak ICC increasing may be prevented or improved because a variation characteristic of a word line voltage is differently set for each group. The number of word lines in each group may vary from the ratios described above, but in some embodiments, at least 1/6 of all word lines are in each group, and in some embodiments, at least 1/2 of all word lines are in a center group.

Figure 13:
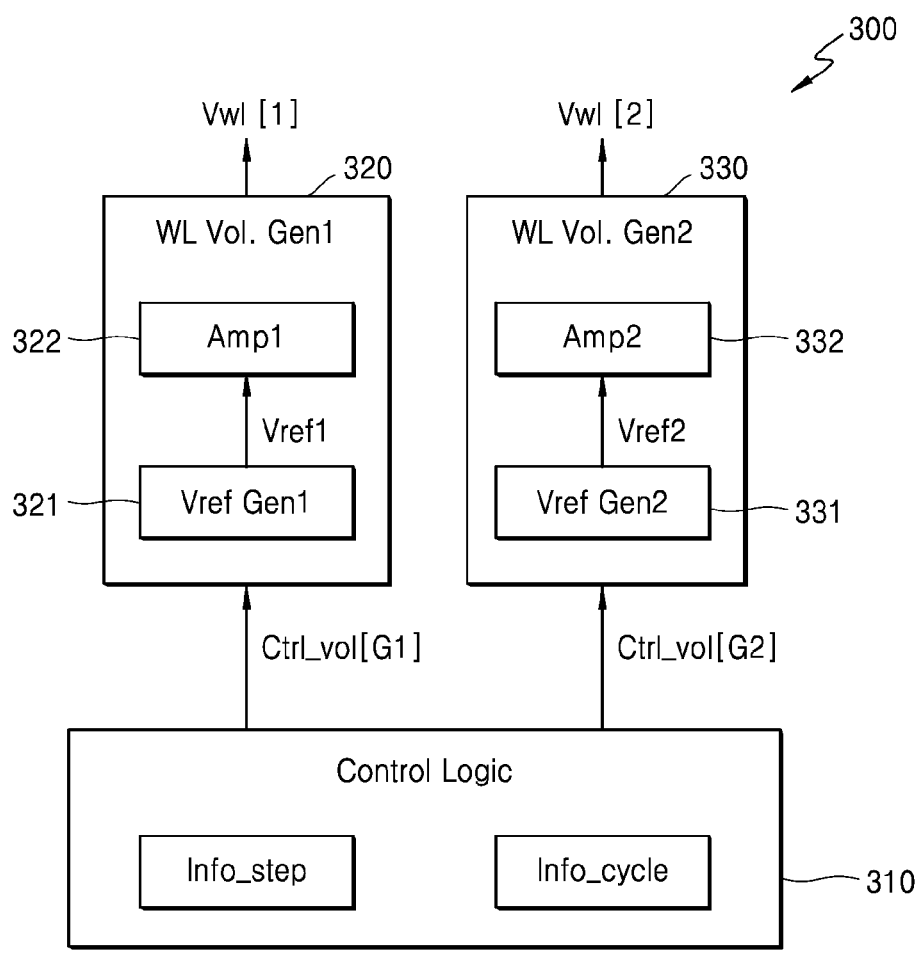
FIGS. 13 and 14 are diagrams illustrating an example which generates a word line voltage, according to an embodiment.
Figure 14:
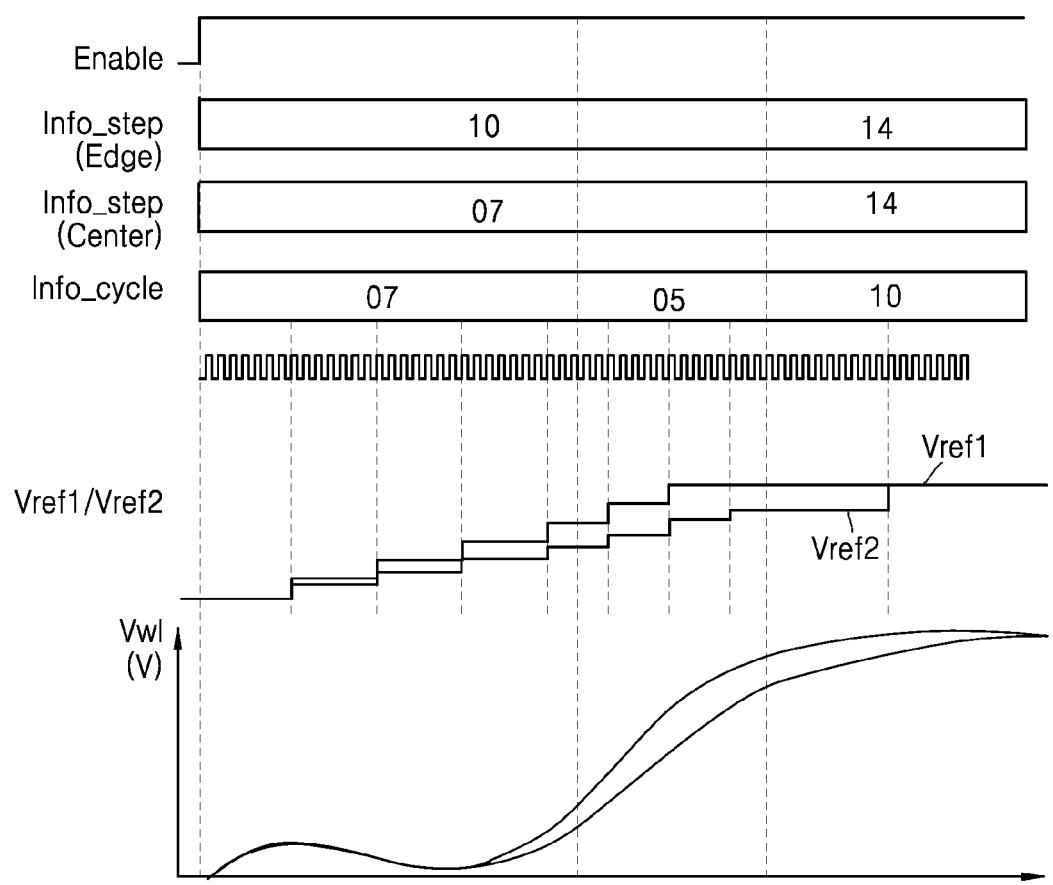

FIGS. 13 and 14 are diagrams illustrating an example which generates a word line voltage, according to an embodiment. It should be noted that a word line voltage as described herein refers to a voltage applied over time. The voltage may have different voltage levels at different times.

Referring to FIG. 13, a memory device 300 may include a control logic 310 and one or more word line voltage generators. In FIG. 13, a first voltage generator 320, which provides a first word line voltage Vwl[1] to word lines of a first group, and a second voltage generator 330, which provides a second word line voltage Vwl[2] to word lines of a second group, are illustrated. For example, as the first group corresponds to an edge group, a slope of the first word line voltage Vwl[1] may be relatively high, and as the second group corresponds to a center group, a slope of the second word line voltage Vwl[2] may be relatively low.

The control logic 310 may include a storage circuit (not shown) and may store a variety of information (for example, step information Info_step and cycle information Info_cycle) for controlling a slope of a word line voltage. For example, the step information Info_step and the cycle information Info_cycle may be non-volatilely stored in the memory device 300 and may be loaded into the storage circuit (not shown) of the control logic 310 when the memory device 300 is initially driven. When word lines of the memory device 300 are classified into a plurality of groups, the step information Info_step and the cycle information Info_cycle corresponding to each of the plurality of groups may be stored in the control logic 310.

Alternatively, according to an embodiment, the storage circuit (not shown) may be disposed outside the control logic 310 to store the step information Info_step and the cycle information Info_cycle and may provide the step information Info_step and the cycle information Info_cycle to the control logic 310.

The control logic 310 may provide a first slope control signal Ctrl_vol[G1] to the first voltage generator 320 and may provide a second slope control signal Ctrl_vol[G2] to the second voltage generator 330. For example, the control logic 310 may directly provide the step information Info_step and the cycle information Info_cycle, corresponding to each group, as a slope control signal for each group. Alternatively, the control logic 310 may process the step information Info_step and the cycle information Info_cycle corresponding to each group, and thus, may generate the slope control signal which controls a reference voltage generator included in each word line voltage generator.

The first voltage generator 320 may include a first reference voltage generator 321 and a first amplifier 322, and the second voltage generator 330 may include a second reference voltage generator 331 and a second amplifier 332. The first reference voltage generator 321 may generate a first reference voltage Vref1 having a waveform based on the first slope control signal Ctrl_vol[G1], and the second reference voltage generator 331 may generate a second reference voltage Vref2 having a waveform based on the second slope control signal Ctrl_vol[G2]. Also, the first amplifier 322 may output the first word line voltage Vwl[1] provided to word lines of an edge group on the basis of the first reference voltage Vref1, and the second amplifier 332 may output the second word line voltage Vwl[2] provided to word lines of an edge group on the basis of the second reference voltage Vref2.

An operation example of the memory device 300 illustrated in FIG. 13 will be described below with reference to FIG. 14.

Each of the first voltage generator 320 and the second voltage generator 330 may generate a word line voltage where a slope thereof is adjusted based on a voltage level variation of a reference voltage, and thus, a slope of the first word line voltage Vwl[1] may be adjusted based on a waveform of the first reference voltage Vref1 and a slope of the second word line voltage Vwl[2] may be adjusted based on a waveform of the second reference voltage Vref2. For example, when a level of the reference voltage is relatively high, a word line voltage having a relatively large slope may be generated based thereon.

Referring to FIG. 14, levels of the first reference voltage Vref1 and the second reference voltage Vref2 may be controlled when an enable signal Enable is activated, and a voltage variation of each of the first reference voltage Vref1 and the second reference voltage Vref2 may be adjusted based on the step information Info_step corresponding to a voltage level variation amount and the cycle information Info_cycle corresponding to a variation timing. In the embodiment of FIG. 14, an example is illustrated where pieces of step information Info_step corresponding to an edge group and a center group are differently set and pieces of cycle information Info_cycle corresponding to the edge group and the center group are equally set. However, the inventive concept is not limited thereto, and for example, pieces of step information Info_step corresponding to an edge group and a center group may be differently set and pieces of cycle information Info_cycle corresponding to the edge group and the center group may be differently set. Alternatively, pieces of step information Info_step corresponding to an edge group and a center group may be equally set and pieces of cycle information Info_cycle corresponding to the edge group and the center group may be differently set, and thus, a voltage variation of the first reference voltage Vref1 and a voltage variation of the second reference voltage Vref2 may be differently set.

For example, in at least some period while a level of the first word line voltage Vwl[1] is increasing, a value of step information Info_step(edge) corresponding to an edge group may be greater than a value of cycle information Info_step (center) corresponding to a center group. Also, at a timing indicated by the cycle information Info_cycle, a level of the first reference voltage Vref1 and a level of the second reference voltage Vref2 may differently increase based on a value of the step information Info_step(edge) corresponding to the edge group and a value of the cycle information Info_step(center) corresponding to the center group. For example, the cycle information Info_cycle may be information corresponding to a clock count.

As the cycle information Info_cycle corresponds to 7, the step information Info_step(edge) corresponding to the edge group and the cycle information Info_step(center) corresponding to the center group may be referred to whenever a clock count corresponds to 7, and thus, a level of the first reference voltage Vref1 corresponding to the edge group may largely increase compared to a level of the second reference voltage Vref2 corresponding to the edge group. Also, as the cycle information Info_cycle corresponds to 5, the step information Info_step(edge) corresponding to the edge group and the cycle information Info_step(center) corresponding to the center group may be referred to whenever a clock count corresponds to 5, and then, as the cycle information Info_cycle corresponds to 10, the step information Info_step(edge) corresponding to the edge group and the cycle information Info_step(center) corresponding to the center group may be referred to whenever a clock count corresponds to 10. In this case, regardless of the step information Info_step and the cycle information Info_cycle, when a word line voltage reaches a target level, a level of the reference voltage may be fixed without increasing, and in the embodiment of FIG. 14, a case where a level of the first reference voltage Vref1 reaches the target level is illustrated.

Figure 15:
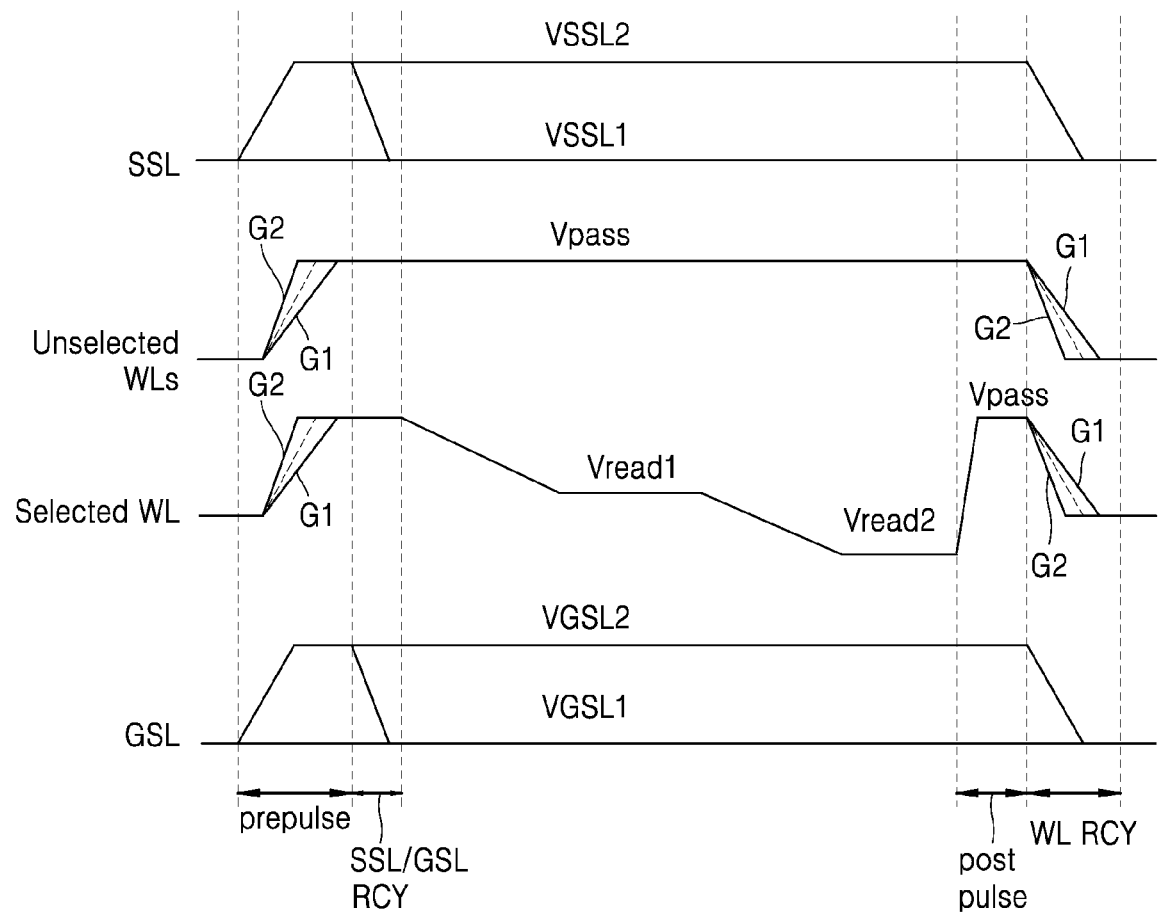
FIGS. 15 and 16 are diagrams illustrating an operation example of a memory device according to various embodiments.
Figure 16:
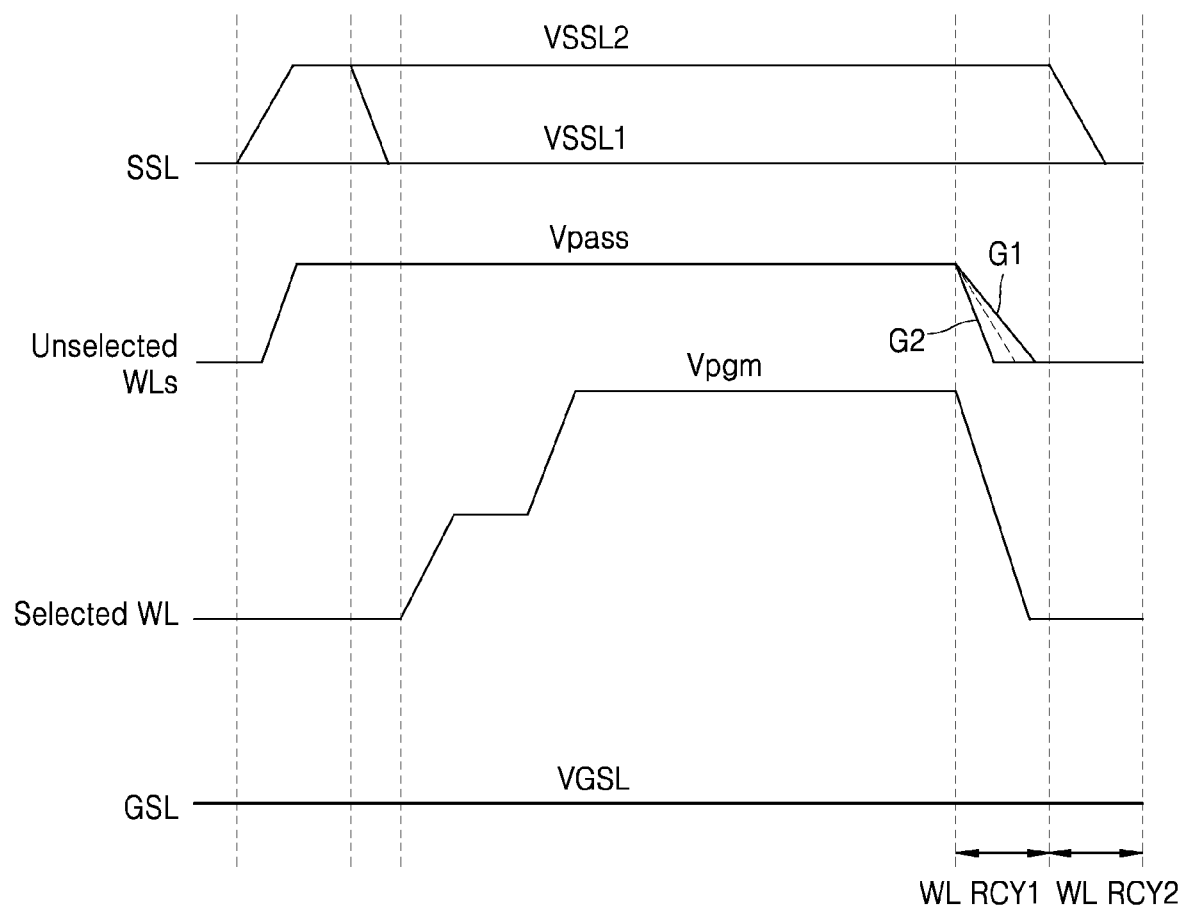

FIGS. 15 and 16 are diagrams illustrating an operation example of a memory device according to various embodiments. In the embodiments of FIGS. 15 and 16, a case is illustrated where a slope of a word line voltage is adjusted for each group in various periods of a memory operation in addition to a prepulse period. A detailed description of the same signal described above in the embodiment of FIG. 9 among signals illustrated in the embodiment of FIGS. 15 and 16 is omitted.

Referring to FIG. 15, an example is illustrated where a word line voltage is adjusted for each group in a prepulse period and a recycle period in a read operation. As in the embodiment described above, a first string selection line voltage VSSL1 and a first ground selection line voltage VGSL1 each corresponding to a prepulse may be provided to a string selection line SSL and a ground selection line GSL of a non-selected cell string in the prepulse period. Also, word lines including a selected word line and a non-selected word line may be classified into a plurality of groups, a word line voltage having a relatively large slope may be provided to word lines of a second group G2 corresponding to an edge group, and a word line voltage having a relatively small slope may be provided to word lines of a first group G1 corresponding to a center group.

Furthermore, according to an embodiment, a word line recycle period may be performed after a post pulse period, and the word lines of a first group G1 and the word lines of the second group G2 may have a certain slope and may decrease during the word line recycle period. Similarly to the embodiment described above, a slope of a word line voltage of the edge group and a slope of a word line voltage of the center group may be differently set, and for example, during the word line recycle period, a word line voltage having a relatively large slope may be provided to the word lines of the second group G2 corresponding to the edge group, and a word line voltage having a relatively small slope may be provided to the word lines of the first group G1 corresponding to the center group. Based on slope control, a channel characteristic may be controlled in an initialization operation of each of various lines of a word line recycle period in the read operation.

Furthermore, FIG. 16 illustrates a control example of a word line voltage for each group, according to embodiments.

Referring to FIG. 16, in a program operation, the first string selection line voltage VSSL1 provided to a string selection line SSL of the non-selected cell string may be deactivated, and a second string selection line voltage VSSL2 provided to a string selection line SSL of the selected cell string may increase to the target level. Also, in a program period, a pass voltage may be applied to the non-selected word line, a program voltage where a voltage level increases incrementally may be provided to the selected word line, and a ground voltage may be provided to the ground selection line GSL.

When the program operation is completed, at least one word line recycle period may be performed, and for example, word lines may be initialized during a first word line recycle period and the second string selection line voltage VSSL2 may be initialized during a second word line recycle period. In this case, a slope control operation according to an embodiment may be performed on the selected word line and/or the non-selected word lines in the first word line recycle period, and in FIG. 16, an example is illustrated where a slope is differently controlled for each group as non-selected word lines are classified into at least two groups. For example, a word line voltage having a relatively large slope may be provided to the word lines of the second group G2 corresponding to the edge group, and a word line voltage having a relatively small slope may be provided to the word lines of the first group G1 corresponding to the center group. Based on slope control, a channel characteristic may be controlled in an initialization operation of each of various lines of a word line recycle period in the program operation. In the embodiment of FIG. 16, an example is illustrated where, in the program operation, a relatively high program voltage Vpgm is applied to the selected word line and a word line recycle period is relatively longer than the read operation, and thus, slope control is not performed on the selected word line for each group and a slope is controlled on only the non-selected word lines for each group.

Furthermore, in the embodiments described above, an example where embodiments are applied in some periods of the read operation and the program operation has been described above, but the inventive concept is not limited thereto. For example, a word line setup period or an initialization period (or a recycle period) may be provided in various operations in association with the memory operation, and a slope of a word line voltage may be adjusted for each group in various periods, according to embodiments.

Figure 17:
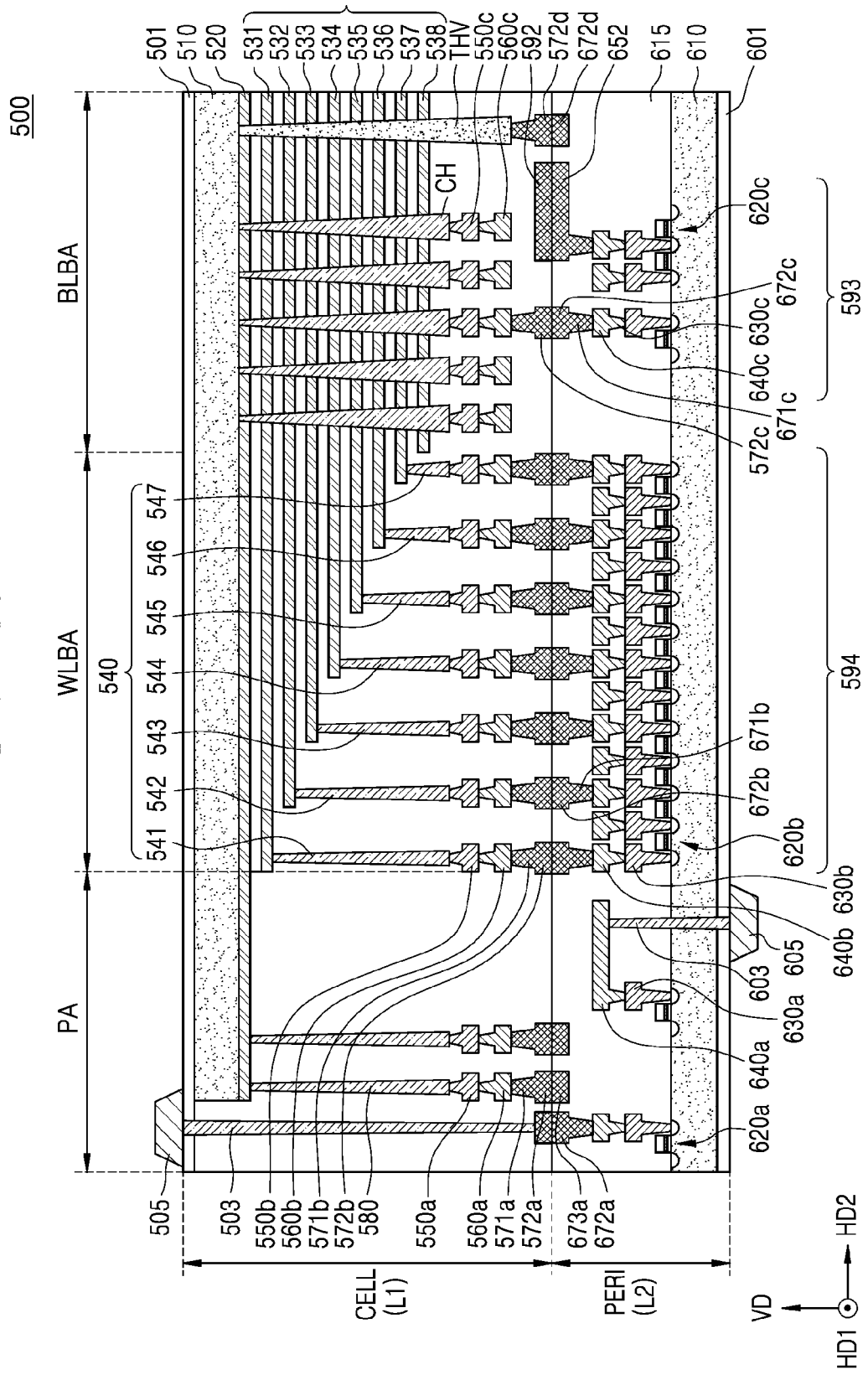
FIG. 17 is a cross-sectional view of a memory device having a B-VNAND structure, according to an embodiment.

FIG. 17 is a cross-sectional view of a memory device 500 having a B-VNAND structure, according to an embodiment. When a non-volatile memory included in a memory device is implemented as a bonding vertical NAND (B-VNAND) type flash memory, the non-volatile memory may have a structure illustrated in FIG. 17.

Referring to FIG. 17, a cell region CELL of the memory device 500 may correspond to a first semiconductor layer L1, and a peripheral circuit region PERI thereof may correspond to a second semiconductor layer L2. Each of the peripheral circuit region PERI and the cell region CELL of the memory device 500 may include an external pad bonding region PA, a word line bonding region WLBA, and a bit line bonding region BLBA. For example, the plurality of word lines WL, the plurality of string selection lines SSL, the plurality of ground selection lines GSL, and the memory cell array 110 of FIG. 2 may be provided in the first semiconductor layer L1, and the control logic circuit 120, the row decoder 130, the voltage generator 140, and the page buffer circuit 150 of FIG. 2 may be provided in the second semiconductor layer L2.

The peripheral circuit region PERI may include a first substrate 610, an interlayer insulation layer 615, a plurality of circuit elements 620a to 620c provided on the first substrate 610, a plurality of first metal layers 530a to 530c respectively connected to the plurality of circuit elements 620a to 620c, and a plurality of second metal layers 640a to 640c formed on the plurality of first metal layers 530a to 530c. In an embodiment, the first metal layers 530a to 530c may include tungsten having a relatively high resistance, and the second metal layers 640a to 640c may include copper having a relatively low resistance.

Herein, only the first metal layers 630a to 630c and the second metal layers 640a to 640c are illustrated, but the inventive concept is not limited thereto and one or more metal layers may be further formed on the second metal layers 640a to 640c. At least some of the one or more metal layers formed on the second metal layers 640a to 640c may include aluminum having a resistance which is lower than that of copper included in the second metal layers 640a to 640c.

The interlayer insulation layer 615 may be disposed on the first substrate 610 to cover the plurality of circuit elements 620a to 620c, the first metal layers 530a to 530c, and the second metal layers 640a to 640c and may include an insulating material such as silicon oxide or silicon nitride.

Lower bonding metals 671b and 672b may be formed on the second metal layer 640b of the word line bonding region WLBA. In the word line bonding region WLBA, the lower bonding metals 671b and 672b of the peripheral circuit region PERI may be electrically connected to upper bonding metals 571b and 572b of the cell region CELL by using a bonding scheme, and the lower bonding metals 671b and 672b and the upper bonding metals 571b and 572b may include aluminum, copper, or tungsten.

The cell region CELL may provide at least one memory block. The cell region CELL may include a second substrate 510 and a common source line 520. A plurality of word lines 531 to 538 (530) may be stacked on the second substrate 510 in a vertical direction VD vertical to a top surface of the second substrate 510. String selection lines and a ground selection line may be arranged on and under the word lines 530, and the plurality of word lines 530 may be arranged between the string selection lines and the ground selection line.

In the bit line bonding region BLBA, a channel structure CH may extend in a direction vertical to the top surface of the second substrate 510 and may pass through the word lines 530, the string selection lines, and the ground selection line. The channel structure CH may include a data storage layer, a channel layer, and a buried insulation layer, and the channel layer may be electrically connected to the first metal layer 550c and the second metal layer 560c. For example, the first metal layer 550c may be a bit line contact, and the second metal layer 560c may be a bit line. In an embodiment, the bit line 560c may extend in a second horizontal direction HD2 parallel to the top surface of the second substrate 510.

In an embodiment, a region where the channel structure CH and the bit line 560c are provided may be defined as the bit line bonding region BLBA. The bit line 560c may be electrically connected to the circuit elements 620c providing a page buffer 593 of the peripheral circuit region PERI in the bit line bonding region BLBA. For example, the bit line 560c may be connected to the upper bonding metals 571c and 572c of the cell region CELL, and the upper bonding metals 571c and 572c may be connected to the lower bonding metals 671c and 672c connected to the circuit elements 620c of the page buffer 593. Therefore, the page buffer 593 may be connected to the bit line 560c through the bonding metals 571c, 572c, 671c, and 672c.

In an embodiment, the memory device 400 may further include a through via THV disposed in the bit line bonding region BLBA. The through via THV may pass through the word lines 530 and may extend in the vertical direction VD. The through via THV may be connected to the common source line 520 and/or the second substrate 510. Although not shown, an insulation ring may be disposed near the through via THV, and the through via THV may be insulated from the word lines 530. The through via THV may be connected to the peripheral circuit region PERI through the upper bonding metals 572d and the lower bonding metals 672d.

In the bit line bonding region BLBA, the word lines 530 may extend in a first horizontal direction HD1 parallel to the top surface of the second substrate 510 and may be connected to a plurality of cell contact plugs 541 to 547 (540). The word lines 530 and the cell contact plugs 540 may be connected to one another at pads which are provided as at least some of the word lines 530 extend by different lengths in the vertical direction VD. The first metal layer 550b and the second metal layer 560b may be sequentially connected to upper portions of the cell contact plugs 540 connected to the word lines 530. The cell contact plugs 540 may be connected to the peripheral circuit region PERI through the upper bonding metals 571b and 572b of the cell region CELL and the lower bonding metals 671b, 672b of the peripheral circuit region PERI, in the bit line bonding region BLBA.

The cell contact plugs 540 may be electrically connected to the circuit elements 620b providing the row decoder 594 in the peripheral circuit region PERI. In an embodiment, an operation voltage of each of the circuit elements 620b providing the row decoder 594 may differ from an operation voltage of each of the circuit elements 620c providing the page buffer 593. For example, the operation voltage of each of the circuit elements 620c providing the page buffer 593 may be greater than the operation voltage of each of the circuit elements 620b providing the row decoder 594.

A common source line contact plug 580 may be disposed in the external pad bonding region PA. The common source line contact plug 580 may include a conductive material such as metal, a metal compound, or polysilicon and may be electrically connected to the common source line 520. The first metal layer 550a and the second metal layer 560a may be sequentially stacked on the common source line contact plug 580. For example, a region where the common source line contact plug 580, the first metal layer 550a, and the second metal layer 560a are provided may be defined as the external pad bonding region PA.

Furthermore, a plurality of I/O pads 505 and 605 may be disposed in the external pad bonding region PA. A lower insulation layer 601 covering a bottom surface of the first substrate 610 may be formed under the first substrate 610, and a first I/O pad 605 may be formed on the lower insulation layer 601. The first I/O pad 605 may be connected to at least one of the plurality of circuit elements 620a to 620c disposed in the peripheral circuit region PERI through the first I/O contact plug 603 and may be isolated from the first substrate 610 by the lower insulation layer 601. Also, a side insulation layer may be disposed between the first I/O contact plug 603 and the first substrate 610 and may electrically isolate the first I/O contact plug 603 from the first substrate 610.

An upper insulation layer 501 covering the top surface of the second substrate 510 may be formed on the second substrate 510, and a second I/O pad 505 may be formed on the upper insulation layer 501. The second I/O pad 505 may be connected to at least one of the plurality of circuit elements 620a to 620c disposed in the peripheral circuit region PERI through the second I/O contact plug 503.

According to an embodiment, the second substrate 510 and the common source line 520 may not be disposed in a region where the second I/O contact plug 503 is provided. Also, the second I/O contact plug 503 may not overlap the word lines 530 in a third direction (a Z-axis direction). The second I/O contact plug 503 may be apart from the second substrate 510 in a direction parallel to the top surface of the second substrate 510, and the second I/O contact plug 503 may pass through an interlayer insulation layer of the cell region CELL and may be connected to the second I/O pad 505.

According to embodiments, the first I/O pad 605 and the second I/O pad 505 may be optionally formed. For example, the memory device 500 may include only the first I/O pad 605 disposed on the first substrate 610, or may include only the second I/O pad 505 disposed on the second substrate 510. Alternatively, the memory device 500 may include all of the first I/O pad 605 and the second I/O pad 505.

In each of the external pad bonding region PA and the bit line bonding region BLBA included in each of the cell region CELL and the peripheral circuit region PERI, a metal pattern of an uppermost metal layer may be provided as a dummy pattern, or the uppermost metal layer may be empty.

The memory device 500 may include a lower metal pattern 673a, having the same shape as that of an upper metal pattern 572a formed in the uppermost metal layer of the cell region CELL, in the uppermost metal layer of the peripheral circuit region PERI on the basis of the upper metal pattern 572a, in the external pad bonding region PA. The lower metal pattern 673a formed in the uppermost metal layer of the peripheral circuit region PERI may not be connected to a separate contact in the peripheral circuit region PERI. Similarly, an upper metal pattern having the same shape as that of a lower metal pattern of the peripheral circuit region PERI may be formed in an upper metal layer of the cell region CELL on the basis of a lower metal pattern formed in the uppermost metal layer of the peripheral circuit region PERI, in the external pad bonding region PA.

Lower bonding metals 471b and 472b may be formed on the second metal layer 640b of the word line bonding region WLBA. In the word line bonding region WLBA, the lower bonding metals 671b and 672b of the peripheral circuit region PERI may be electrically connected to the upper bonding metals 571b and 572b of the cell region CELL by using a bonding scheme.

Also, in the word line bonding region WLBA, an upper metal pattern 592 having the same shape as that of a lower metal pattern 652 may be formed in an uppermost metal layer of the cell region CELL on the basis of the lower metal pattern 652 formed in the uppermost metal layer of the peripheral circuit region PERI. A contact may not be formed on the upper metal pattern 592 formed in the uppermost metal layer of the cell region CELL.

Figure 18:
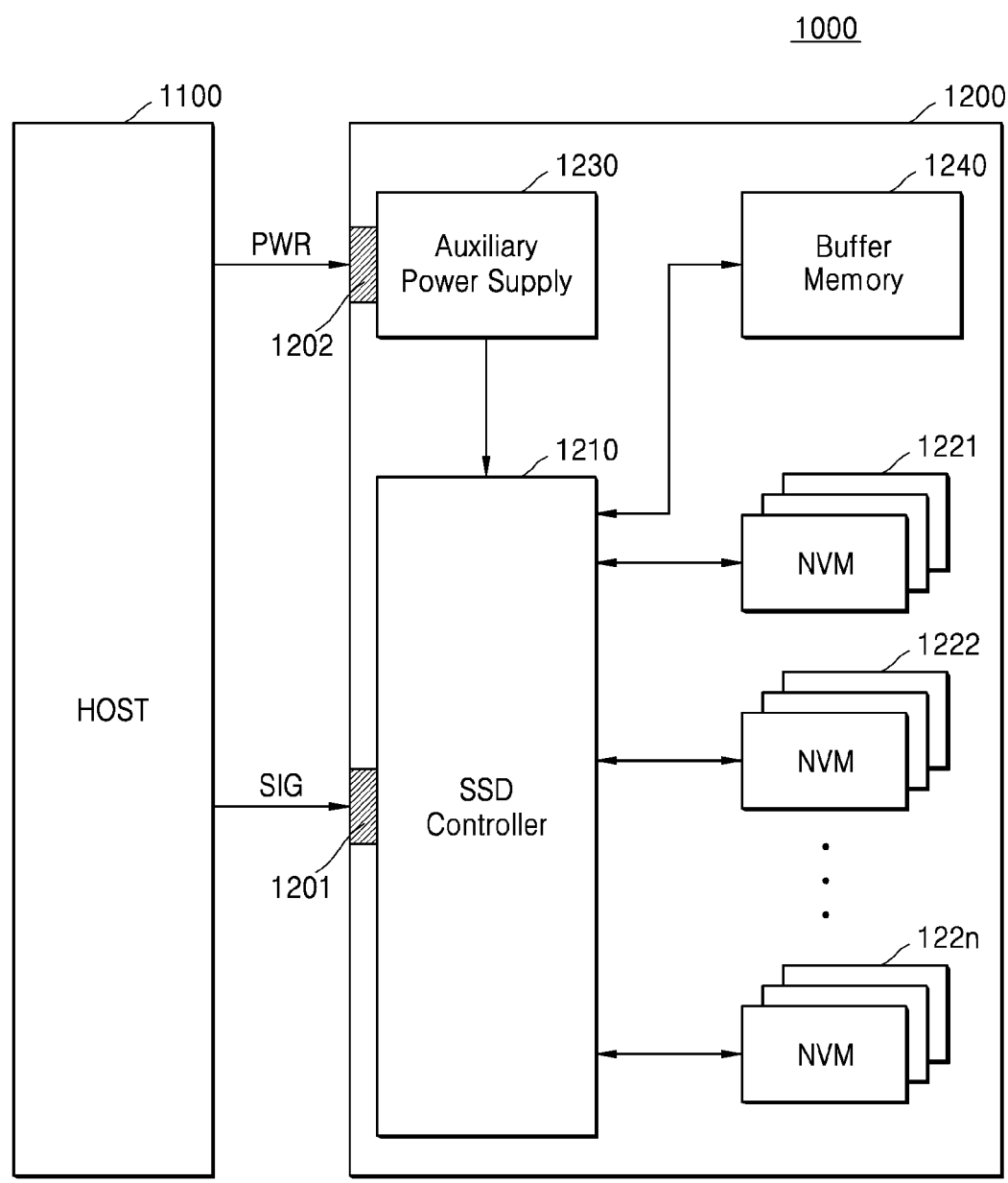
FIG. 18 is a block diagram illustrating a solid state drive (SSD) system including a memory device according to an embodiment.

FIG. 18 is a block diagram illustrating a solid state drive (SSD) system 1000 including a memory device according to an embodiment.

Referring to FIG. 18, the SSD system 1000 may include a host 1100 and an SSD 1200. The SSD 1200 may transmit and receive a signal to and from a host 1100 through a signal connector 1201 and may be supplied with power through the power connector 1202. The SSD 1200 may include an SSD controller 1210, an auxiliary power supply 1230, a buffer memory 1240, and a plurality of memory devices 1221-122n. The memory devices 1221-122n may each include a vertical stack type NAND flash memory device. In this case, the SSD 1200 may be implemented with the embodiments described above with reference to FIGS. 1 to 17.

Hereinabove, exemplary embodiments have been described in the drawings and the specification. Embodiments have been described by using the terms described herein, but this has been merely used for describing the inventive concept and has not been used for limiting a meaning or limiting the scope of the inventive concept defined in the following claims. Therefore, it may be understood by those of ordinary skill in the art that various modifications and other equivalent embodiments may be implemented from the inventive concept. Accordingly, the spirit and scope of the inventive concept may be defined based on the spirit and scope of the following claims.

While the inventive concept has been particularly shown and described with reference to embodiments thereof, it will be understood that various changes in form and details may be made therein without departing from the spirit and scope of the following claims.

What is claimed is:
1. A memory device comprising:
  a memory cell array including a plurality of cell strings, each of the plurality of cell strings including a string selection transistor, a plurality of memory cells, and a ground selection transistor arranged vertically, the string selection transistor being connected to a string selection line, the plurality of memory cells being respectively connected to a plurality of word lines, and the ground selection transistor being connected to a ground selection line;

a voltage generating circuit configured to generate word line voltages provided to the plurality of word lines; and a control logic configured to output a slope control signal adjusting a voltage level variation characteristic of the word line voltages provided from the voltage generating circuit, wherein:

a first cell string of the plurality of cell strings comprises a first edge group including one or more word lines of the plurality of word lines, the first edge group adjacent to the string selection line, a second edge group including one or more word lines of the plurality of word lines, the second edge group adjacent to the ground selection line, and a center group including one or more word lines of the plurality of word lines between the first edge group and the second edge group, and the voltage generating circuit is configured to provide a first word line voltage having a first slope to the one or more word lines of the first edge group and provide a second word line voltage, which has a second slope which is less than the first slope, to the one or more word lines of the center group in response to the slope control signal, during a prepulse period of a read operation of the memory device.

2. The memory device of claim 1, wherein:
the first cell string comprises a first memory stack, and a second memory stack stacked vertically on each other,
the first edge group is arranged adjacent to the string selection line of the first memory stack, and the second edge group is arranged adjacent to a ground selection line of the second memory stack, and
the center group comprises word lines disposed in the first memory stack and word lines disposed in the second memory stack.

3. The memory device of claim 1, wherein:
the voltage generating circuit is configured to provide a third word line voltage having a third slope to the one or more word lines of the second edge group, and
the first slope is the same as the third slope.

4. The memory device of claim 1, wherein:
the voltage generating circuit is configured to provide a third word line voltage having a third slope to the one or more word lines of the second edge group, and
the third slope is less than the first slope and greater than the second slope.

5. The memory device of claim 1, wherein:
the center group comprises a first center group adjacent to the first edge group and a second center group adjacent to the second edge group, and
word line voltages having different slopes are applied to the first center group and the second center group.

6. The memory device of claim 1, wherein:
the first cell string comprises N number of word lines (where N is an integer of 4 or more), and
the first edge group comprises N/4 number of word lines, the center group comprises N/2 number of word lines, and the second edge group comprises N/4 number of word lines.

7. The memory device of claim 1, wherein:
the voltage generating circuit comprises a first voltage generator configured to provide the first word line voltage to the first edge group and a second voltage generator configured to provide the second word line voltage to the center group, and
the first voltage generator and the second voltage generator are configured to respectively generate the first word line voltage and the second word line voltage having different slopes in response to different slope control signals from the control logic.

8. The memory device of claim 7, wherein:
each of the first voltage generator and the second voltage generator comprises a reference voltage generator configured to generate a reference voltage and an amplifier configured to generate a word line voltage, where a slope thereof is adjusted on the basis of a variation characteristic of the reference voltage, and
the slope control signal comprises at least one of step information and cycle information for adjusting the variation characteristic of the reference voltage.

9. The memory device of claim 8, wherein the step information is information representing an increase level of the reference voltage, and the cycle information is information representing a voltage level variation period of the reference voltage.

10. The memory device of claim 1, wherein:
the read operation comprises a word line recycle period for initializing word lines after a read period, and
during the word line recycle period, a slope of the first word line voltage differs from a slope of the second word line voltage.

11. The memory device of claim 1, wherein:
a program operation of the memory device comprises a word line recycle period for initializing word lines after a program period, and
during the word line recycle period, a slope of the first word line voltage differs from a slope of the second word line voltage.

12. The memory device of claim 1, wherein:
the first cell string corresponds to a selected cell string, and a second cell string of the plurality of cell strings corresponds to a non-selected cell string, and
after the prepulse period, a string selection line voltage is applied to the string selection line of the first cell string, and a ground voltage is applied to the string selection line of the second cell string.

13. A memory device comprising:
a memory cell array including a plurality of cell strings, each of the plurality of cell strings including a string selection transistor, a plurality of memory cells, and a ground selection transistor arranged vertically, the string selection transistor being connected to a string selection line, the plurality of memory cells being respectively connected to a plurality of word lines, and the ground selection transistor being connected to a ground selection line; and
a voltage generating circuit configured to generate a plurality of word line voltages provided to the plurality of word lines,
wherein the plurality of word lines are classified into a plurality of groups on the basis of how close a corresponding word line is to the string selection line or the ground selection line, and
the voltage generating circuit is configured to provide word line voltages having slopes having different values with respect to the plurality of groups, in a first period of a program operation or a read operation of the memory device.

14. The memory device of claim 13, wherein the plurality of groups comprise a first edge group including one or more word lines, the first edge group adjacent to the string selection line, a second edge group including one or more word lines, the second edge group adjacent to the ground selection line, and a center group including one or more word lines between the first edge group and the second edge group.

15. The memory device of claim 14, wherein:
the first period corresponds to a prepulse period in the read operation, and
the voltage generating circuit is configured to, during the prepulse period, provide a first word line voltage having a first slope to the one or more word lines of the first edge group, and provide a second word line voltage having a second slope, which is less than the first slope, to the one or more word lines of the center group.

16. The memory device of claim 15, wherein, the voltage generating circuit is configured to, during the prepulse period, provide a third word line voltage having the first slope to the one or more word lines of the second edge group.

17. The memory device of claim 14, wherein:
the first period corresponds to a word line recycle period in the read operation, and
the voltage generating circuit is configured to, during the word line recycle period, provide a first word line voltage having a first slope to the one or more word lines of the first edge group, and provide a second word line voltage having a second slope, which is less than the first slope, to the one or more word lines of the center group.

18. The memory device of claim 14, wherein the first period corresponds to a word line recycle period in the program operation, and
the voltage generating circuit is configured to, during the word line recycle period, provide a first word line voltage having a first slope to the one or more word lines of the first edge group, and provide a second word line voltage having a second slope, which is less than the first slope, to the one or more word lines of the center group.

19. An operating method of a memory device, including a memory cell array including a plurality of cell strings, each of the plurality of cell strings including a string selection transistor, a plurality of memory cells, and a ground selection transistor arranged vertically, the string selection transistor being connected to a string selection line, the plurality of memory cells being respectively connected to a plurality of word lines, and the ground selection transistor being connected to a ground selection line, the operating method comprising:
setting a voltage level variation characteristic of a word line voltage provided to the plurality of word lines on the basis of group information about the plurality of word lines, in an initial setting operation of the memory device;
providing a first word line voltage having a first slope to a first edge group including one or more word lines among the plurality of word lines, the first edge group adjacent to the string selection line, in a prepulse period of a read operation of the memory device;
providing a second word line voltage having a second slope to a second edge group including one or more word lines among the plurality of word lines, the second edge group adjacent to the ground selection line, in the prepulse period; and
providing a third word line voltage having a third slope to a center group including one or more word lines between the first edge group and the second edge group, in the prepulse period,
wherein the first slope and the second slope are greater than the third slope.

20. The operating method of claim 19, wherein the first slope is the same as the second slope.

* * * * *